(12) United States Patent
Otto et al.

(10) Patent No.: US 8,030,246 B2
(45) Date of Patent: Oct. 4, 2011

(54) LOW RESISTANCE SPLICE FOR HIGH TEMPERATURE SUPERCONDUCTOR WIRES

(75) Inventors: Alexander Otto, Chelmsford, MA (US); Eric R. Podtburg, Natick, MA (US)

(73) Assignee: American Superconductor Corporation, Devens, MA (US)

( * ) Notice: Subject to any disclaimer, the term of this patent is extended or adjusted under 35 U.S.C. 154(b) by 975 days.

(21) Appl. No.: 11/880,586

(22) Filed: Jul. 23, 2007

(65) Prior Publication Data

US 2009/0298696 A1 Dec. 3, 2009

Related U.S. Application Data

(60) Provisional application No. 60/832,724, filed on Jul. 21, 2006.

(51) Int. Cl.
*H01L 39/24* (2006.01)
(52) U.S. Cl. ........ 505/234; 505/220; 505/230; 505/231; 505/236; 505/238; 505/470; 505/927; 174/125.1; 252/500
(58) Field of Classification Search .................. 505/230, 505/231, 234, 236, 238, 220, 470, 927; 174/125.1; 252/500
See application file for complete search history.

(56) References Cited

U.S. PATENT DOCUMENTS

| | | |
|---|---|---|
| 5,231,074 A | 7/1993 | Cima et al. |
| 5,583,319 A | 12/1996 | Lieurance |
| 5,912,503 A | 6/1999 | Chan et al. |
| 6,022,832 A | 2/2000 | Fritzemeier et al. |
| 6,027,564 A | 2/2000 | Fritzemeier et al. |
| 6,190,752 B1 | 2/2001 | Do et al. |
| 6,436,317 B1 | 8/2002 | Malozemoff et al. |
| 6,444,917 B1 | 9/2002 | Scudiere et al. |
| 6,537,689 B2 | 3/2003 | Schoop et al. |
| 6,745,059 B2 | 6/2004 | Buczek et al. |
| 6,797,313 B2 | 9/2004 | Fritzemeier et al. |
| 6,828,507 B1 | 12/2004 | Fritzemeier et al. |
| 6,974,501 B1 | 12/2005 | Zhang et al. |

(Continued)

FOREIGN PATENT DOCUMENTS

| | | |
|---|---|---|
| WO | WO-98/58415 | 12/1998 |

(Continued)

OTHER PUBLICATIONS

U.S. Appl. No. 09/007,372, filed Jan. 15, 1998.

(Continued)

*Primary Examiner* — Jessica L Ward
*Assistant Examiner* — Paul A Wartalowicz
(74) *Attorney, Agent, or Firm* — Occhiuti Rohlicek & Tsao LLP

(57) ABSTRACT

Under one aspect, a laminated, spliced superconductor wire includes a superconductor joint, which includes (i) first and second superconductor wires, each wire including a substrate, a superconductor layer overlying the substrate, and a cap layer overlying the superconductor layer; and (ii) a conductive bridge, the conductive bridge including a substrate, a superconductor layer overlying the substrate, and a cap layer overlying the superconductor layer, wherein the cap layer of the conductive bridge is in electrically conductive contact with a portion of the cap layer of each of the first and second superconductor wires through an electrically conductive bonding material. The spliced wire also includes (b) a stabilizer structure surrounding at least a portion of the superconductor joint, wherein the superconductor joint is in electrical contact with the stabilizer structure; and (c) a substantially nonporous electrically conductive filler, wherein the filler substantially surrounds the superconductor joint.

35 Claims, 21 Drawing Sheets

U.S. PATENT DOCUMENTS

| | | | |
|---|---|---|---|
| 7,071,148 B1 * | 7/2006 | Selvamanickam et al. ... | 505/234 |
| 7,365,271 B2 * | 4/2008 | Knoll et al. ................. | 174/125.1 |
| 7,772,158 B2 * | 8/2010 | Kramer et al. ................. | 505/237 |
| 2006/0040829 A1 | 2/2006 | Rupich et al. | |
| 2006/0063680 A1 | 3/2006 | Ignatiev et al. | |
| 2006/0073975 A1 | 4/2006 | Thieme et al. | |
| 2006/0073979 A1 | 4/2006 | Thieme et al. | |
| 2006/0094603 A1 | 5/2006 | Li et al. | |
| 2007/0179063 A1 | 8/2007 | Malozemoff et al. | |

FOREIGN PATENT DOCUMENTS

| | | |
|---|---|---|
| WO | WO-99/16941 | 4/1999 |
| WO | WO-99/17307 | 4/1999 |
| WO | WO-00/58044 | 10/2000 |
| WO | WO-00/58530 | 10/2000 |
| WO | WO-00/08231 | 2/2001 |
| WO | WO-01/08169 | 2/2001 |
| WO | WO-01/08232 | 2/2001 |
| WO | WO-01/08233 | 2/2001 |
| WO | WO-01/08235 | 2/2001 |
| WO | WO-01/08236 | 2/2001 |
| WO | WO-01/11428 | 2/2001 |
| WO | WO-01/15245 | 3/2001 |
| WO | WO-01/26164 | 4/2001 |
| WO | WO-01/26165 | 4/2001 |
| WO | WO-02/35615 | 5/2002 |
| WO | WO-2005/081710 | 9/2005 |
| WO | WO-2005/121414 | 12/2005 |
| WO | WO-2006/021003 | 2/2006 |
| WO | WO-2006/023826 | 3/2006 |

OTHER PUBLICATIONS

U.S. Appl. No. 09/500,701, filed Feb. 9, 2000.
U.S. Appl. No. 09/615,669, filed Jul. 14, 2000.
U.S. Appl. No. 10/955,875, filed Sep. 29, 2004, Thieme et al.
U.S. Appl. No. 60/166,297, filed Nov. 18, 1999, Fritzemeier.
U.S. Appl. No. 60/308,957, filed Jul. 31, 2001, Fritzemeier.
U.S. Appl. No. 60/309,116, filed Jul. 31, 2001, Fritzemeier et al.
U.S. Appl. No. 60/667,001, Thieme.
U.S. Appl. No. 60/703,815, Kodenkandath.
U.S. Appl. No. 60/703,836, Li.
U.S. Appl. No. 60/757,855, Kodenkandath.
U.S. Appl. No. 11/393,626, Thieme.
U.S. Appl. No. 60/832,716, Otto.
U.S. Appl. No. 60/832,724, Otto.
U.S. Appl. No. 60/832,871, Rupich.
U.S. Appl. No. 60/866,148, Thieme.
U.S. Appl. No. 11/728,108, Huang.
U.S. Appl. No. 60/922,145, Thieme.
International Search Report issued for PCT/US07/16567, dated Jul. 17, 2008.
Beach, D. et al., "Sol-Gel Synthesis of Rare Earth Aluminate Films as Buffer Layers for High Tc Superconducting Films", *Mat. Res. Soc. Symp. Proc.*, vol. 495, pp. 263-270, 1988.
Lee, D.J. et al., "Alternative Buffer Architectures for High Critical Current Density YBCO Superconducting Deposits on Rolling Assisted Biaxially-Textured Substrates", *Japanese J. Appl. Phys.*, vol. 38, L178-L180, Feb. 15, 1999.
Paranthaman, M. et al., "Growth of biaxially textured RE2O3 buffer layers on rolled-Ni substrates using reactive evaporation for HTS-coated conductors", *Superconductor Sci. Tech.*, vol. 12, pp. 319-325, 1999.
Rupich, M.W. et al., "Growth and Characterization of Oxide Buffer Layers for YBCO Coated Conductors", *I.E.E.E. Trans. on Appl. Supercon.*, vol. 9, No. 2, pp. 1527-1530, Jun. 1999.
Shoup et al, Epitaxial Thin Film Growth of Lanthanum and Neodymium Aluminate Films on Roll-Textured Nickel Using a Sol-Gel Method, *J. Am. Cer. Soc.*, vol. 81, pp. 3019-3021, 1988.

\* cited by examiner

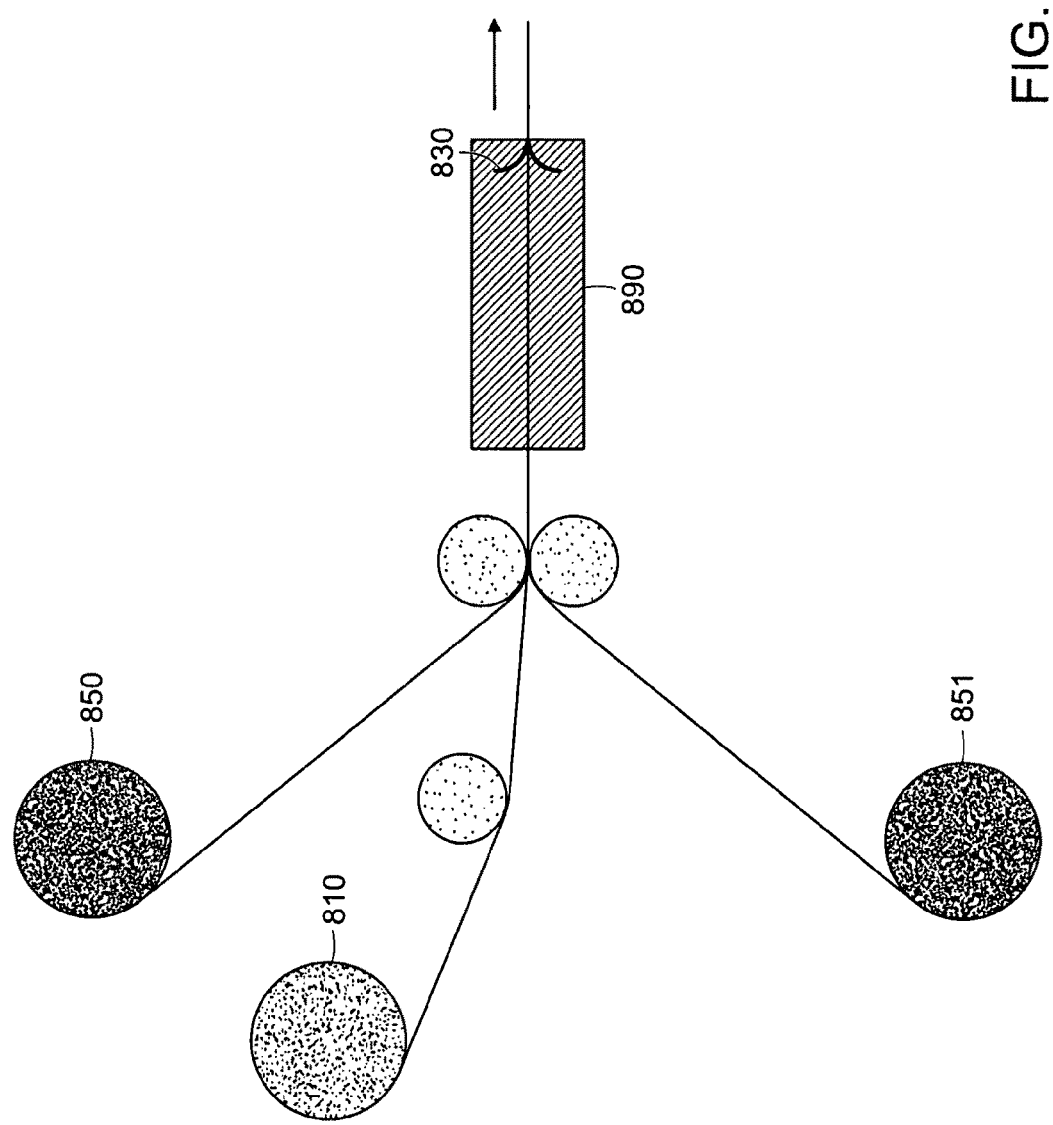

LOW RESISTANCE SPLICE FOR HIGH TEMPERATURE SUPERCONDUCTOR WIRES

RELATED APPLICATIONS

This application claims the benefit of U.S. Provisional Patent Application No. 60/832,724, the entire contents of which are incorporated herein in their entirety.

TECHNICAL FIELD

This application relates to the field of high temperature superconductors.

BACKGROUND

High temperature superconductor (HTS) materials provide a means for carrying extremely large amounts of current with extremely low loss. HTS materials lose all resistance to the flow of direct electrical current and nearly all resistance to the flow of alternating current when cooled below a critical temperature. The development of HTS wires (the expression "wires" is used here for a variety of conductors, including tape-like conductors) using these materials promises a new generation of high efficiency, compact, and environmentally friendly electrical equipment, which has the potential to revolutionize electric power grids, transportation, materials processing, and other industries. However, a commercially viable product has stringent engineering requirements, which has complicated the implementation of the technology in commercial applications.

In the second generation HTS wire (coated conductor) technology, currently under development, the HTS material is generally a polycrystalline rare-earth/alkaline-earth/copper oxide, e.g. yttrium-barium-copper oxide (YBCO). The current carrying capability of the HTS material is strongly related to its crystalline alignment or texture. Grain boundaries formed by the misalignment of neighboring crystalline superconductor grains are known to form an obstacle to superconducting current flow, but this obstacle decreases with the increasing degree of alignment or texture. Therefore to make the material into a commercially viable product, e.g. an HTS wire, the superconducting material must maintain a high degree of crystalline alignment or texture over relatively long distances. Otherwise, the superconducting current carrying capacity (critical current density) will be limited.

A schematic of a typical second-generation HTS wire 100 is shown in FIG. 1. The wire includes substrate 110, buffer layer 120 (which could include multiple buffer layers), superconductor layer 130, and cap layer 140, and is fabricated as described below. It should be noted that in this and all subsequent figures, the dimensions are not to scale. Superconductor materials can be fabricated with a high degree of crystallographic alignment or texture over large areas by growing a thin layer 130 of the material epitaxially on top of a flexible tape-shaped substrate 110 and buffer layer 120, which are fabricated so that the surface of the topmost layer has a high degree of crystallographic texture at its surface. When the crystalline superconductor material is grown epitaxially on this surface, its crystal alignment grows to match the texture of the substrate. In other words, the substrate texture provides a template for the epitaxial growth of the crystalline superconductor material. Further, the substrate provides structural integrity to the superconductor layer.

Substrate 110 and/or buffer 120 can be textured to provide a template that yields an epitaxial superconductor layer 130 with excellent superconducting properties such as high critical current density. Materials such as nickel, copper, silver, iron, silver alloys, nickel alloys, iron alloys, stainless steel alloys, and copper alloys can be used, among others, in the substrate. Substrate 110 can be textured using a deformation process, such as one involving rolling and recrystallization annealing the substrate. An example of such a process is the rolling-assisted biaxially textured substrate (RABiTS) process. In this case large quantities of metal can be processed economically by deformation processing and annealing and can achieve a high degree of texture.

One or more buffer layers 120 can be deposited or grown on the surface of substrate 110 with suitable crystallographic template on which to grow the superconductor layer 130. Buffer layers 120 also can provide the additional benefit of preventing diffusion over time of atoms from the substrate 110 into the crystalline lattice of the superconductor material 130 or of oxygen into the substrate material. This diffusion, or "poisoning," can disrupt the crystalline alignment and thereby degrade the electrical properties of the superconductor material. Buffer layers 120 also can provide enhanced adhesion between the substrate 110 and the superconductor layer 130. Moreover, the buffer layer(s) 120 can have a coefficient of thermal expansion that is well matched to that of the superconductor material. For implementation of the technology in commercial applications, where the wire may be subjected to stress, this feature is desirable because it can help prevent delamination of the superconductor layer from the substrate.

Alternatively, a non-textured substrate 110 such as Hastelloy can be used, and textured buffer layer 120 deposited by means such as the ion-beam-assisted deposition (IBAD) or inclined substrate deposition (ISD). Additional buffer layers 120 may be optionally deposited epitaxially on the IBAD or ISD layer to provide the final template for epitaxial deposition of an HTS layer 130.

By using a suitable combination of a substrate 110 and one or more buffer layers 120 as a template, superconductor layer 130 can be grown epitaxially with excellent crystal alignment or texture, also having good adhesion to the template surface, and with a sufficient barrier to poisoning by atoms from the substrate. The superconductor layer 130 can be deposited by any of a variety of methods, including the metal-organic deposition (MOD) process, metal-organic chemical vapor deposition (MOCVD), pulsed laser deposition (PLD), thermal or e-beam evaporation, or other appropriate methods. Lastly, a cap layer 140 can be added to the multilayer assembly, which helps prevent contamination of the superconductor layer from above. The cap layer 140 can be, e.g., silver or a silver-gold alloy, and can be deposited onto the superconductor layer 130 by, e.g., sputtering. In the case where slitting is performed after lamination, the cap layer may also include an additional laminated metal "stabilizer" layer, such as a copper or stainless steel layer, bonded to the cap layer, e.g., by soldering.

An exemplary as-fabricated multilayer HTS wire 100 includes a biaxially textured substrate 110 of nickel with 5% tungsten alloy; sequentially deposited epitaxial buffer layers 120 of $Y_2O_3$, YSZ, and $CeO_2$; epitaxial layer 130 of YBCO; and a cap layer 140 of Ag. Exemplary thicknesses of these layers are: a substrate of about 25-75 microns, buffer layers of about 75 nm each, a YBCO layer of about 1 micron, and a cap layer of about 1-3 microns. HTS wires 100 as long as 100 m have been manufactured thus far using techniques such as those described above.

During use, it is desirable that the HTS wire is able to tolerate bend strains. A bend induces tensile strain on the convex outer surface of the bend, and compressive strain on the concave inner surface of the bend, thereby subjecting the HTS layer to tensile or compressive strains depending on the direction in which the wire is bent. While a modest amount of compressive stress can actually enhance the current carrying capacity of an HTS layer, in general subjecting the whole assembly to stress (especially repeated stress) places the wire at risk of mechanical damage. For example, cracks could be formed and propagate in the HTS layer, degrading its mechanical and electrical properties, or the different layers could delaminate from each other or from the substrate.

Methods for reducing stress in the HTS layer are described, e.g., in U.S. Pat. Nos. 6,745,059 and 6,828,507. For example, a copper strip, chosen to have similar thickness and mechanical features to the substrate, can be bonded onto the upper surface of the insert. This sandwiches the HTS layer roughly in the middle of the overall structure, so if the assembly is bent, the HTS layer is neither at the outer nor inner surface of the bend. Two of these assemblies can also be bonded together at their respective copper strips to form a single HTS wire assembly. In this case, the two substrates face outward, and the copper tapes are in the middle of the assembly. In this case the inclusion of a second assembly provides additional current carrying capacity; however, electrical contact to the HTS layers requires splicing the wire open, or partially removing one of the inserts in the contact section.

A further issue for coated conductor HTS wires is that of environmental contamination when the wire is in use. Environmental exposure can slowly degrade the electrical performance of HTS layers. Also, in the presence of cryogenic liquids such as liquid nitrogen in contact with the wire, the liquid can diffuse into pores within the wire, and on warming can form "balloons" that can damage the wire. Sealing the wire is desirable to prevent either environmental exposure of the HTS layers or penetration of the liquid cryogen into the wire. Seals for HTS assemblies are described in, e.g. U.S. Pat. No. 6,444,917.

The coated conductor approach has been greatly advanced in recent years to the point where long length manufacturing of reinforced tapes is being established. However, the utility of these tapes would be greatly increased if they could be made to any required length via low resistance joints that are mechanically robust and conform to tight geometric tolerances.

SUMMARY

Low cost, low resistance, mechanically robust, and geometrically uniform joints for superconductor wires are described.

Under one aspect, a laminated, spliced superconductor wire includes a superconductor joint, which includes (i) first and second superconductor wires, each wire including a substrate, a superconductor layer overlying the substrate, and a cap layer overlying the superconductor layer; and (ii) a conductive bridge, the conductive bridge including a substrate, a superconductor layer overlying the substrate, and a cap layer overlying the superconductor layer, wherein the cap layer of the conductive bridge is in electrically conductive contact with a portion of the cap layer of each of the first and second superconductor wires through an electrically conductive bonding material. The spliced wire also includes (b) a stabilizer structure surrounding at least a portion of the superconductor joint, wherein the superconductor joint is in electrical contact with the stabilizer structure; and (c) a substantially nonporous electrically conductive filler, wherein the filler substantially surrounds the superconductor joint.

One or more embodiments include one or more of the following features. The conductive bridge has a length selected to provide the superconductor joint with a predetermined conductivity. The conductive bridge is bonded to at least ten millimeters of the cap layers of each of the first and second superconductor wires. The conductive bridge is bonded to at least ten centimeters of the cap layers of each of the first and second superconductor wires. The conductive bridge includes a section cut from one of the first and second superconductor wires. The filler bonds stabilizer structure to the superconductor joint. The conductive filler includes a material selected from the group consisting of solder, metal, metal alloy, metal amalgam, and conductive polymer. The conductive filler and the conductive bonding material have the same composition. The conductive filler and the conductive bonding material have melting points that differ by less than about 10%. The electrically conductive bonding material includes low resistance solder. The low resistance solder includes one of indium, Pb—Sn, and Pb—Sn—Ag. The low resistance solder forms edge seals on an end of each of the first and second superconductor wires and on first and second ends of the conductive bridge. An end of at least one of the first and second superconductive wires and the conductive bridge is cut so as to mitigate stress in the spliced wire. The end is cut on a diagonal. Insulation surrounding at least the superconductor joint. The first and second superconductor wires and the conductive bridge each further include a buffer layer between the substrate and the superconductor layer. The cap layer of the first and second superconductor wires and the conductive bridge include silver. The stabilizer structure includes a metal selected from the group consisting of aluminum, copper, silver, nickel, iron, stainless steel, aluminum alloy, copper alloy, silver alloy, nickel alloy, and iron alloy. A conductive pathway between the first and second wires has a resistance of less than about 1 milli-ohm. A conductive pathway between the first and second wires has a resistance of less than about 500 micro-ohms. A conductive pathway between the first and second wires has a resistance of less than about 200 milli-ohms. A conductive pathway between the first and second wires has a resistance of less than about 100 milli-ohms.

Under another aspect, a laminated, spliced superconductor wire includes (a) first and second stabilized superconductor wires, each wire including a substrate, a superconductor layer overlying the substrate, a cap layer overlying the superconductor layer, and a stabilizer structure bonded with electrically conductive filler to the cap layer. The laminated, spliced superconductor wire also includes (b) a conductive bridge, the conductive bridge including a substrate, a superconductor layer overlying the substrate, a cap layer overlying the superconductor layer, and a stabilizer structure bonded with electrically conductive filler to the cap layer, wherein the conductive bridge is in electrically conductive contact with a portion of each of the first and second superconductor wires through an electrically conductive bonding material. The laminated, spliced superconductor wire also includes (c) a plurality of edge seals, a first edge seal substantially sealing an end of the first wire, a second edge seal substantially sealing an end of the second wire, and third and fourth edge seals respectively substantially sealing first and second ends of the conductive bridge.

One or more embodiments include one or more of the following features. The stabilizer structures of each of the first wire, second wire, and conductive bridge are thinned in regions where the conductive bridge is in electrically conductive contact with the first and second wires. The stabilizer structures of each of the first wire, second wire, and conductive bridge are removed in regions where the conductive bridge is in electrically conductive contact with the first and second wires. The conductive bridge is in electrically conductive contact with at least ten millimeters of each of the first and second superconductor wires. The conductive bridge is in electrically conductive contact with at least ten centimeters of each of the first and second superconductor wires. The conductive filler and the conductive bonding material have melting points that differ by less than about 10%. The electrically conductive bonding material and the conductive filler each include low resistance solder. The low resistance solder includes one of indium, Pb—Sn, and Pb—Sn—Ag. A conductive pathway between the first and second wires has a resistance of less than about 1 milli-ohm. A conductive pathway between the first and second wires has a resistance of less than about 500 micro-ohms. A conductive pathway between the first and second wires has a resistance of less than about 200 milli-ohms. A conductive pathway between the first and second wires has a resistance of less than about 100 milli-ohms. The spliced wire of claim 23, wherein the stabilizer structure comprises first and second stabilizer strips.

The expression "HTS wire" or "HTS tape" is intended to indicate a multilayer structure for use in carrying current. The wire or tape may be substantially sealed to the environment. An HTS wire or tape typically includes a substrate, one or more buffer layers, a superconductor layer, a cap layer, and optionally a stabilizer layer that can be considered part of the cap layer. Generally in this HTS wire or tape, the superconductor layer can be electrically isolated from the metallic substrate by the buffer layer(s). However, if electrically conductive buffer layers are used, the superconductor layer can be electrically connected to the metal substrate. Alternatively, an electrically conductive cap layer can be in contact with both the superconductor layer and the substrate, and provide electrical contact between the two.

The expression "sealed" is intended to mean substantially surrounded and substantially physically isolated from the environment. The expression "sealed" may include, but is not required to include, substantial impermeability to penetration from gas or liquid under normal circumstances.

BRIEF DESCRIPTION OF THE DRAWINGS

In the drawing:

FIG. 3C is a schematic illustration of a system and process used to laminate HTS wires to stabilizer strips according to one or more embodiments of the invention.

DETAILED DESCRIPTION

Figure 1:
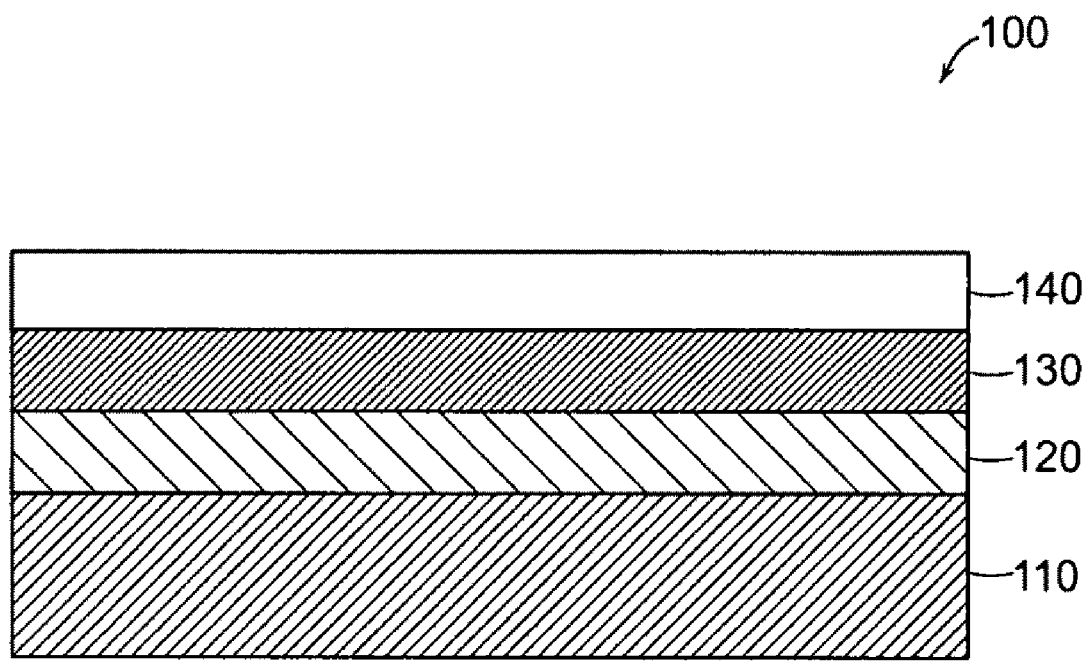
FIG. 1 is a cross-sectional view of a typical HTS wire.

High temperature superconductor (HTS) wires are spliced together at joints to form wires that are arbitrarily long. Each joint between two HTS wires includes a conductive bridge that is laminated to both wires. The conductive bridge provides a low-resistance electrical pathway between the two wires, and also provides mechanical stability so that the joint can be flexed or bent without breaking the electrical connection between the wires and without damaging the HTS layers of the wires.

FIG. 2 illustrates a low-resistance joint 200 between two HTS wires 210, 220. Joint 200 includes first HTS wire 210, second HTS wire 220, and conductive bridge 230. Low resistance solder 240 bonds one end of conductive bridge 230 to one end of first HTS wire 210, and bonds the other end of conductive bridge 230 to one end of second HTS wire 220. The joint also includes edge seals 250 of low resistance solder at the end of each HTS wire or conductive bridge. Note that only one end of each of first HTS wire 210 and second HTS wire 220 is shown, because the wires are long compared to the length of joint 200.

In operation, current flows from first HTS wire 210, through solder 240 and into conductive bridge 230, then flows through solder 240 and into second HTS wire 220. This kind of joint is particularly useful for asymmetrical HTS wires, where one side of the wire has a much lower electrical resistance than the other side. Joining two such wires with a conductive bridge, e.g., as illustrated in FIGS. 2A-2D, allows current to flow through the low resistance sides of each of the two wires 210, 220 and conductive bridge 230, and also maintains the overall symmetry of the wire, so that the substrate will generally remain on the same side of the wire on both sides of the joint. In contrast, a simple lap joint between two wires would result in the substrate being on opposite sides of the wire on either side of the joint, and a butt joint between two wires would exhibit high resistivity as well as low mechanical stability.

First HTS wire 210, second HTS wire 220, and conductive bridge 230 may all be the same kind of HTS wire, e.g., the wire illustrated in FIG. 1. Here, first and second HTS wires 210, 220 both have their respective cap layers 260, 261 facing up, and conductive bridge 230 is flipped over so that its cap layer 262 faces down, i.e., facing the cap layer of the two wires 210, 220. The cap layers 260, 261, and 262 are each conductive, i.e., have a relatively low electrical resistance, and are relatively thin. Thus, arranging two cap layers to electrically contact each other, e.g., placing them adjacent to each other and bonded together with low resistance solder 240, provides a low electrical resistance pathway between two HTS wires. In contrast, the substrate has a relatively high electrical resistance, and may even be insulative, so a joint formed by contacting the substrate sides of wires 210, 220 and conductive strap 230 wire would be unsatisfactorily resistive.

The joint itself may be relatively long, providing a long electrical pathway, i.e., a large contact area, over which to transfer current from the first HTS wire 210 into conductive bridge 230 and then from conductive bridge 230 into second HTS wire 220, and thus reducing the resistance of the joint. For example, conductive bridge 230 may range in length from several centimeters to many meters, and its overlap with each HTS wire may range in length from several millimeters up to several meters. This way, although a joint may not be as conductive as a single HTS wire, the electrical resistance of the joint may be made low enough to allow the spliced wire to carry a normal operating current.

As mentioned above, a low resistance solder 240 such as indium, Pb—Sn, or Pb—Sn—Ag provides the bonding between cap layers 260, 261, and 262. Wetting of the solder 240 may be enhanced with chemical flux that is applied in situ or prior to melting, by mechanical abrasion induced surface activation, or by surface treatments such as plasma etching. The four transition regions from overlap to single wire can optionally be treated by forming solder edge seals 250 from the top of the ledge at the end of the wire down to and along the wire, extending from the cut end. This substantially seals the end to the environment, and also reduces the stress and strain that the wire experiences because of the sharp ledge, which in some circumstances could otherwise lead to kinking, delamination, and/or degradation of the superconductor layer and its critical current. The ends of wires 210 and 220 and conductive bridge 230 may also be cut so as to mitigate the formation of a burr or other protrusion. For example, the ends may be cut on an angle such as a diagonal, so as to reduce the presence of sharp corners in the joint. However, as discussed in greater detail below, the use of certain materials and architectures reduces mechanical stress in the joint, thus obviating the need for cutting the wire ends, or providing solder edge seals, in some applications.

Figure 2A:
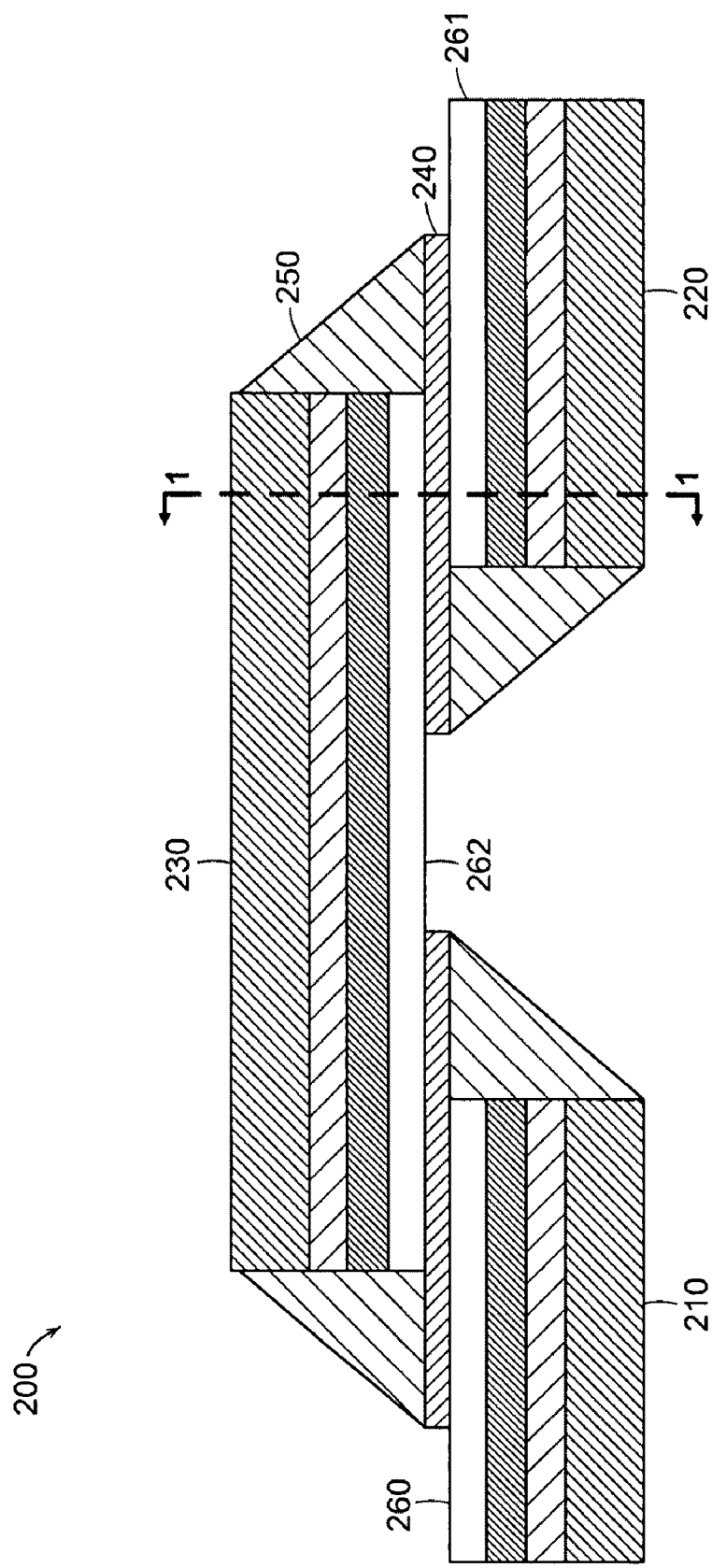
FIG. 2A is a cross-sectional side view of a first HTS wire spliced to a second HTS wire by a conductive bridge according to one or more embodiments of the invention.
Figure 2B:
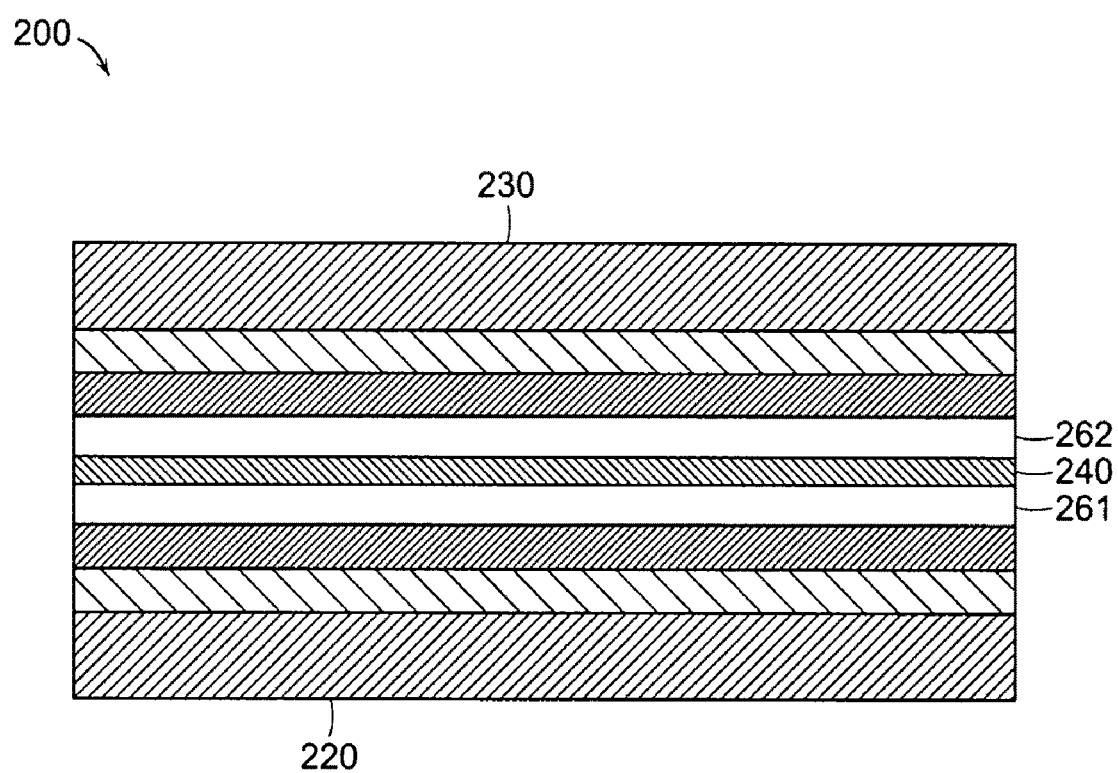
FIG. 2B is a cross-sectional view along line 1-1 of the embodiment illustrated in FIG. 2A.

FIG. 2B shows a cross-section of joint 200 along line 1-1. The cap layer 262 of conductive bridge 230 is bonded to the cap layer 261 of wire 220 with solder 240.

Figure 2C:
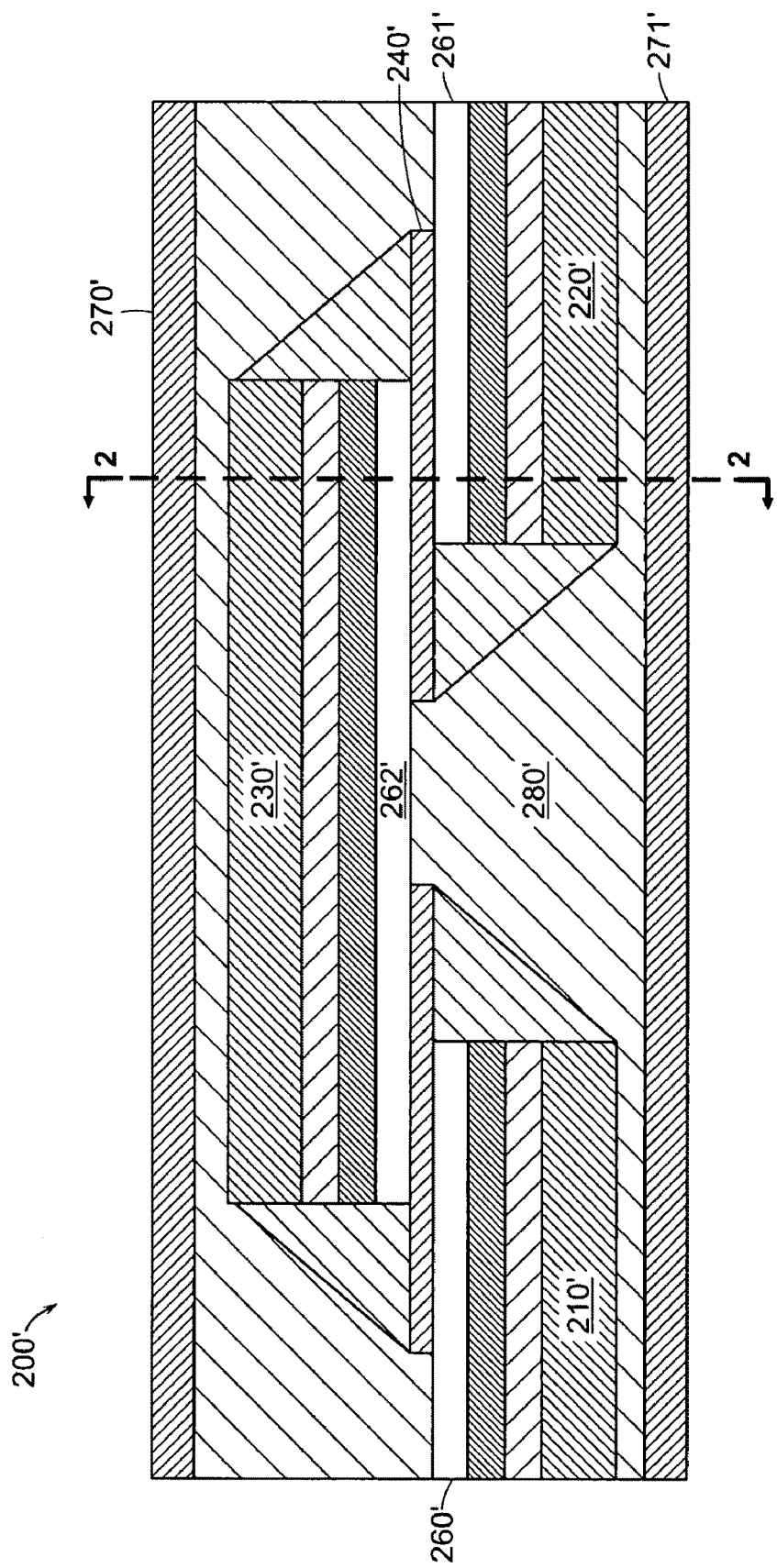
FIG. 2C is a cross-sectional side view of a first HTS wire spliced to a second HTS wire by a conductive bridge according to one or more embodiments of the invention.

In other embodiments, substantially sealing the joined wire to the environment can inhibit and/or prevent contamination of the HTS layer. FIG. 2C illustrates one embodiment of a substantially sealed low-resistance joint 200'. As in FIG. 2A, joint 200' includes first HTS wire 210', second HTS wire 220', and conductive bridge 230'. Low resistance solder 240' bonds one end of conductive bridge 230' to one end of first HTS wire 210', and bonds the other end of conductive bridge 230' to one end of second HTS wire 220'. The joint also includes edge seals 250' of low resistance solder at the end of each HTS wire or conductive bridge. The embodiment illustrated in FIG. 2B also includes a pair of stabilizer strips on either side of the joint, which are bonded to assembly 210', 220', 230' with filler 280'. Filler 280' substantially surrounds and seals the assembly 210', 220', 230' to the environment, and is substantially non-porous. In some embodiments filler 280' may be a conductive material such as solder, e.g., Pb—Sn or Pb—Sn—Ag solder.

Note however that solder "ramps" such as illustrated in FIG. 2C need not be included in all embodiments. For example, the ends of wires 210', 220' and conductive bridge 230' can instead be sealed with solder beads of arbitrary shape. Or, for example, the ends of wires 210', 220' and conductive bridge 230' need not be sealed using edge seals 250' at all, but rather the presence of filler 280' can be used to seal the ends. An additional material can also be used to enhance adhesion of the filler 280' to the ends of wires 210', 220' and conductive bridge 230'.

Figure 2D:
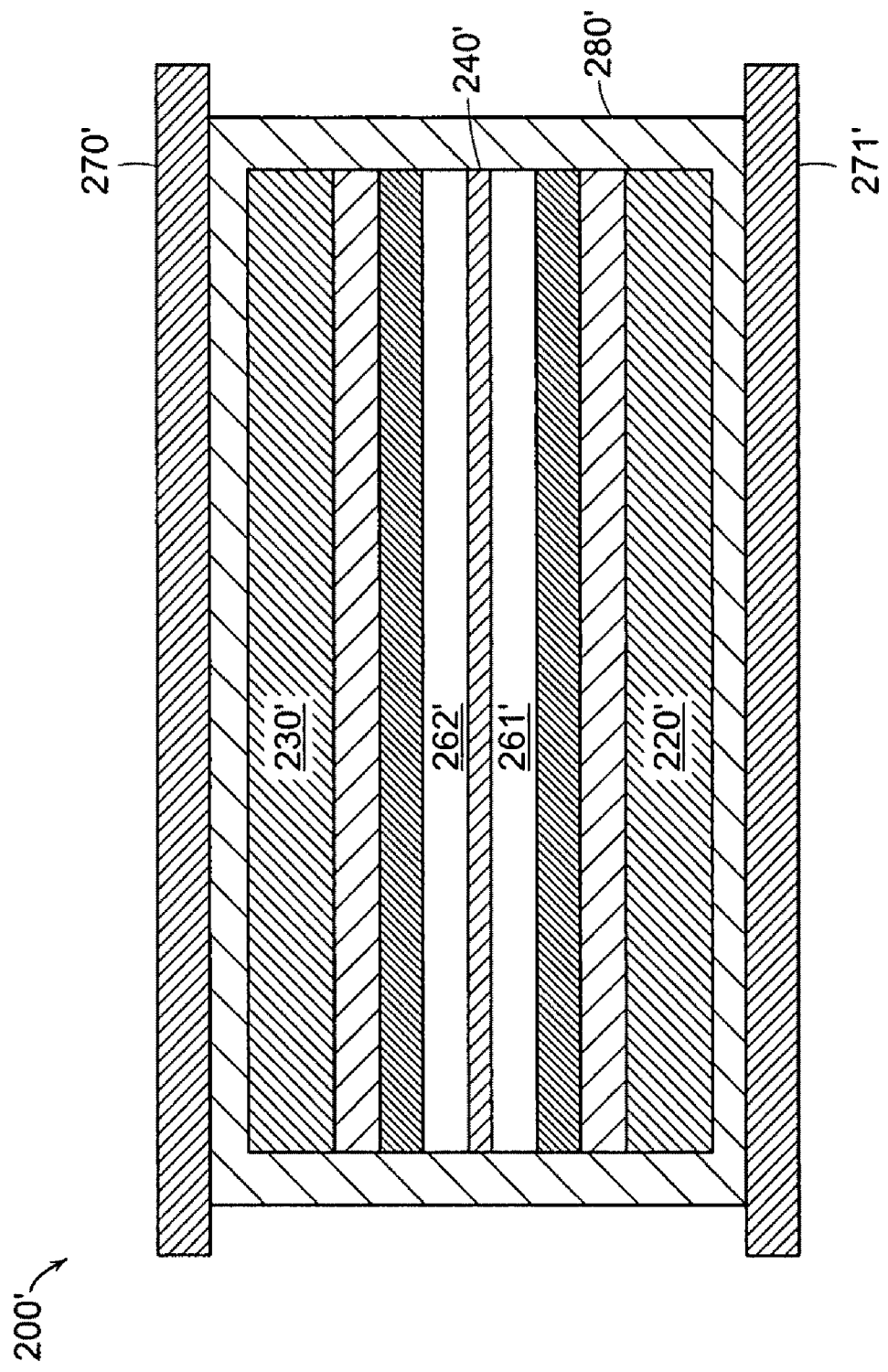
FIG. 2D is a cross-sectional view along line 2-2 of the embodiment illustrated in FIG. 2C.

FIG. 2D is a view along line 2-2 of the embodiment illustrated in FIG. 2C. The cap layer 262' of conductive bridge 230' is bonded to the cap layer 261' of wire 220' with solder 240'. Additionally, filler 280' substantially surrounds assembly 220', 230', and bonds assembly 220', 230' to stabilizer strips 270' and 271'.

Figure 2E:
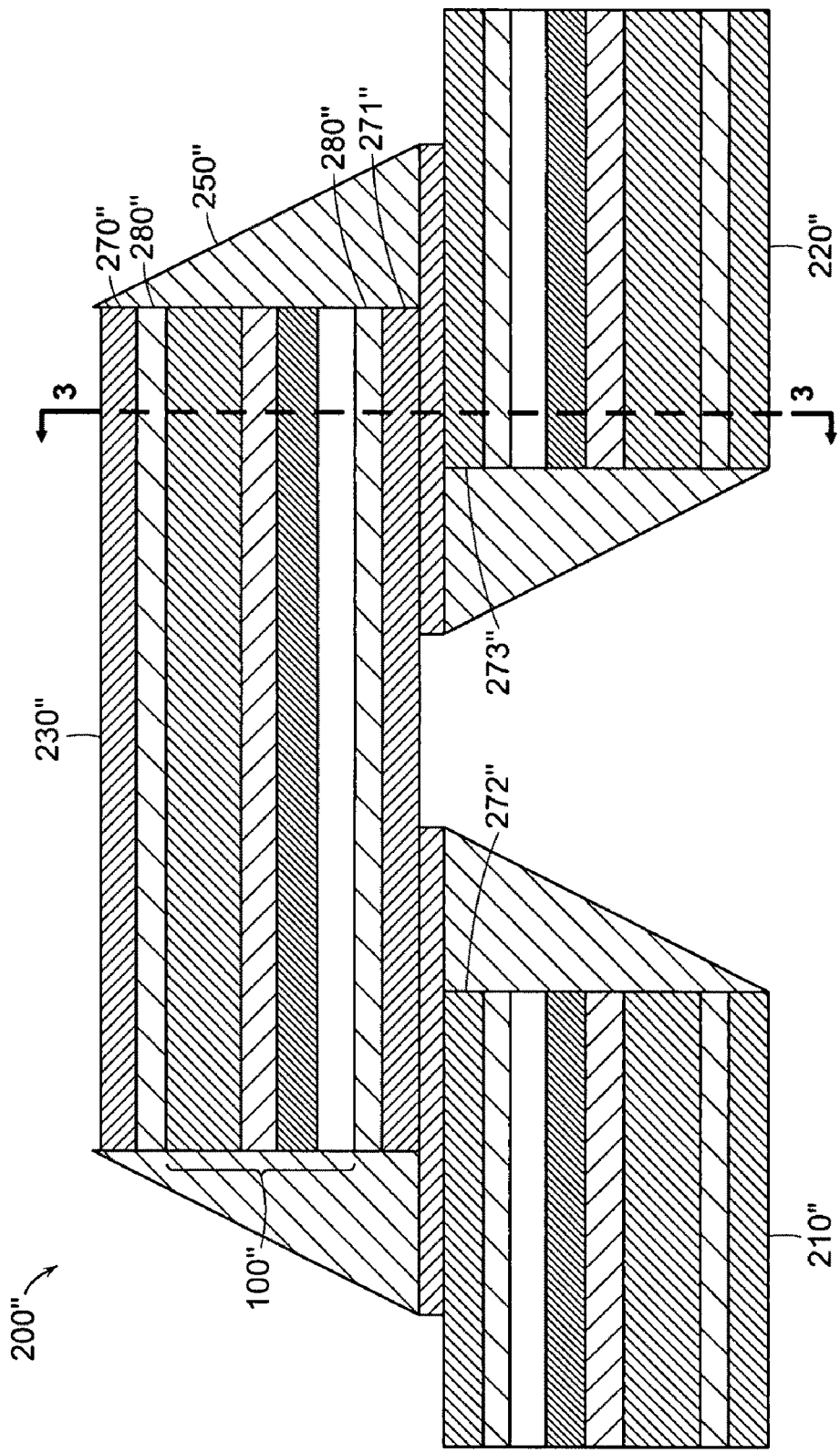
FIG. 2E is a cross-sectional side view of a first HTS wire spliced to a second HTS wire by a conductive bridge according to one or more embodiments of the invention.

FIG. 2E illustrates an embodiment of a joint 200" that includes wires that are each stabilized with stabilizer strips. Here, each of wires 210", 220" and conductive bridge 230" includes wire 100" which may be substantially the same as the wires described above, e.g., including a substrate, buffer layer(s), an HTS layer, and a cap layer 262". Each of wires 210", 220", and conductive bridge 230" also include filler 280" which bonds the respective wire or bridge to upper and lower stabilizer strips. The wires 210", 220" are then joined to the conductive bridge using solder 240" which also forms edge seals 250". The upper stabilizer strip 272" of wire 210" is bonded to the lower stabilizer strip 271" of conductive bridge 230" such that the HTS layers are positioned relatively closely, e.g., separated from each other by stabilizer strips 271", 272", filler 280", solder 240", and the respective cap layers of the wire and bridge, but not separated by a substrate. Thus the conductive pathway between the HTS layers includes relatively highly conductive materials, thus reducing the overall pathway resistance. The upper stabilizer strip 273" of wire 210" is similarly bonded to the lower stabilizer strip 271" of conductive bridge 230".

Figure 2F:
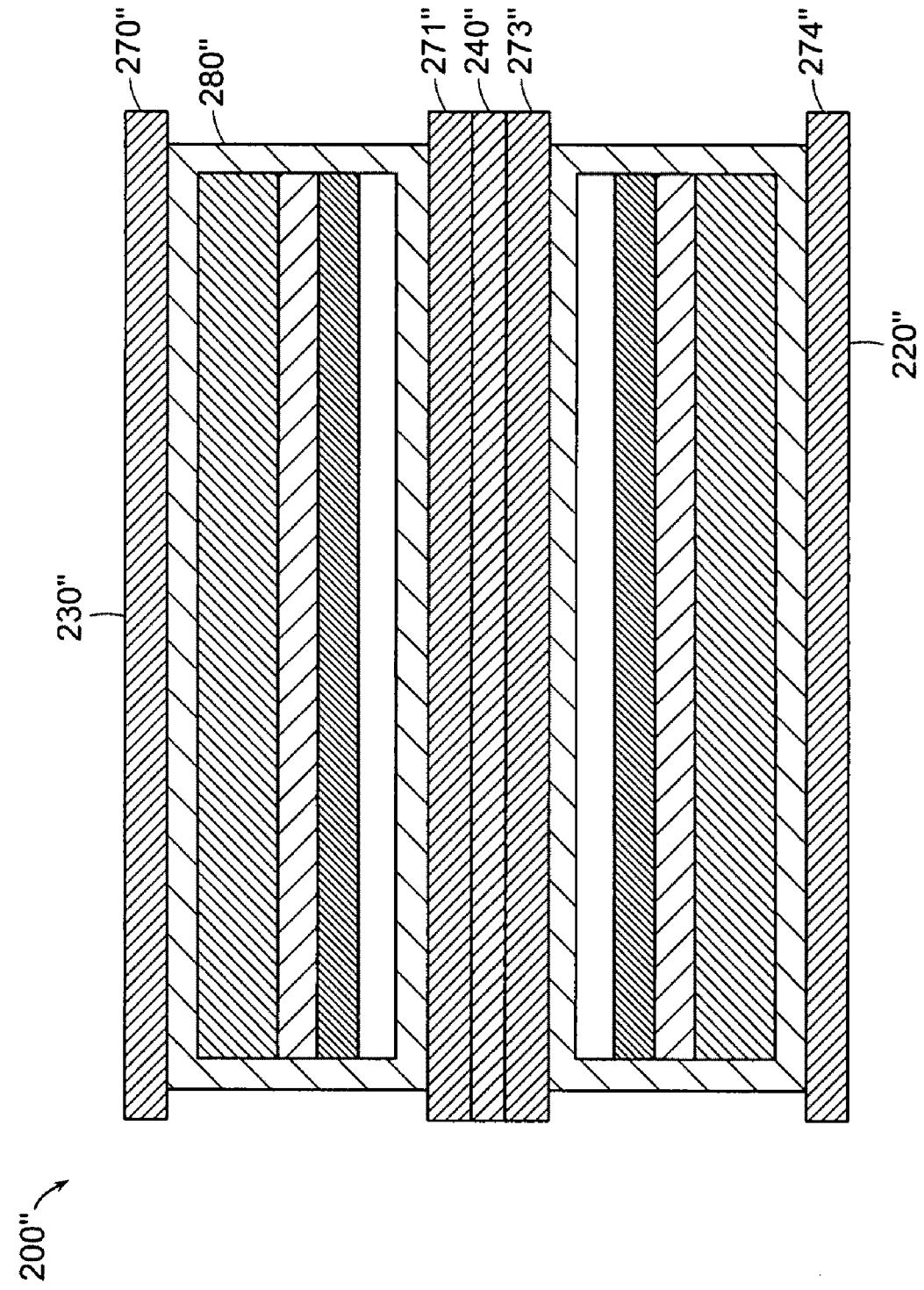
FIG. 2F is a cross-sectional view along line 3-3 of the embodiment illustrated in FIG. 2E.

FIG. 2F is a view along line 3-3 of the embodiment illustrated in FIG. 2E. The lower stabilizer strip 271" of conductive bridge 230" is bonded to the upper stabilizer strip 273" of wire 220" with solder 240". Additionally, within conductive bridge 230", filler 280" substantially surrounds the substrate/buffer/HTS/cap layer assembly, and bonds that assembly to stabilizer strips 270" and 271". Within wire 220", the filler similarly substantially surrounds the substrate/buffer/HTS/cap layer assembly and bonds that assembly to stabilizer strips 273" and 274".

Optionally, the stabilizer strip on one side of each of the wires may be removed or reduced in thickness from the intended overlap region of each end, by for example etching, mechanical abrasion or melt—peeling. Removing or reducing the thickness of the stabilizer strip reduces the joint resistance, because the stabilizer strip may have a somewhat higher resistivity than is desirable over the length of the joint. Alternatively, the stabilizer strip may be left in the wire, and the overlap joint may be lengthened within practical limits to compensate for the additional through joint resistance the stabilizer strip causes. If a higher resistance joint is desired (fault current limiter wire), a layer of stainless steel or other high resistance metal in between the splice can be used to raise the overall resistance of the splice. Also, for example, electrical-insulation coated and/or sealed HTS wires can be joined using the methods described herein. Here, the insulation is removed from the overlap region before or during the splicing operation. Insulation may also be applied or re-applied after the conductive bridge splice joint is made to electrically insulate and/or to seal the conductive bridge splice region.

In the embodiments illustrated in FIGS. 2B and 2C, the back side of the substrates (the side opposite the buffer/HTS/cap layers) can be treated to enhance wetting of the substrate by filler 280'. For example, as described in U.S. patent application Ser. No. 11/193,262, filed Jul. 19, 2005 and entitled "Architecture for High Temperature Superconductor Wire," the entire contents of which are incorporated by reference, some useful wetting layers include Ag, Cu, Ni, Ti, and TiN, which can be coated onto the substrate using, e.g., sputtering.

In embodiments in which current flows through stabilizer strips as it passes through the joint, the surface of the stabilizer strip can be modified prior to lamination in order to improve the resistivity of the joint and/or adhesion of filler or solder to the stabilizer strip. For example, for copper stabilizer strips, a layer of low melting point metal, such as solder or Sn, can be applied to the strips in order to enable faster bonding. Or, for example, for stainless steel stabilizer strips, a Nickel strike layer and a layer pure Sn can be applied, although other low melting point alloys could be used. The Ni strike layer is used to improve the adhesion of Sn to the stainless steel. The Sn layer improves the wettability of the stainless steel by the solder during later lamination to the superconductor wire. The thickness of the Sn layer can range, e.g., from 40 micro inches to 200 or more micro inches, e.g., 50 micro inches. Before application of the Ni and Sn layers, the stainless steel stabilizer strips are prepared by electrically, chemically or mechanically cleaning the surface, e.g., by using a fully activated stainless steel flux, or by scrubbing the surface with an abrasive wheel. This preparation activates the stainless steel, eliminating $Cr_2O_3$ oxide from the surface and thus reducing the resistivity of the surface. Or, for example, for brass stabilizer strips, such stringent activation is not necessary. The brass can be cleaned with a mild detergent and plated with Sn, Sn—Pb, or Cu, for example.

In different embodiments, different materials are suitable for use as filler and/or solder in the joint and/or wires. For example, although many of the example wires described below use indium solder, Sn—Pb and Sn—Pb—Ag may also be suitable. Depending on the filler used to laminate stabilizer strips to the assembly, Sn—Pb and Sn—Pb—Ag may have a similar melting point and a similar mechanical strength to the filler, and thus reduce thermal and mechanical mismatch between the solder and the filler which can result in delamination upon stress. For example, in the case where both the filler and the solder used is Sn—Pb, the mismatch would be negligible and thus result in a particularly strong joint. Thus in some embodiments, solder "ramps" need not have the same configuration as that shown in FIG. 2A in order to mitigate kinking, delamination, and/or degradation of the superconductor layer.

Other architectures for stabilizing joined wires can also be used. Some exemplary architectures that can be used to stabilize joined wires are described in U.S. patent application Ser. No. 11/193,262.

Figure 3A:
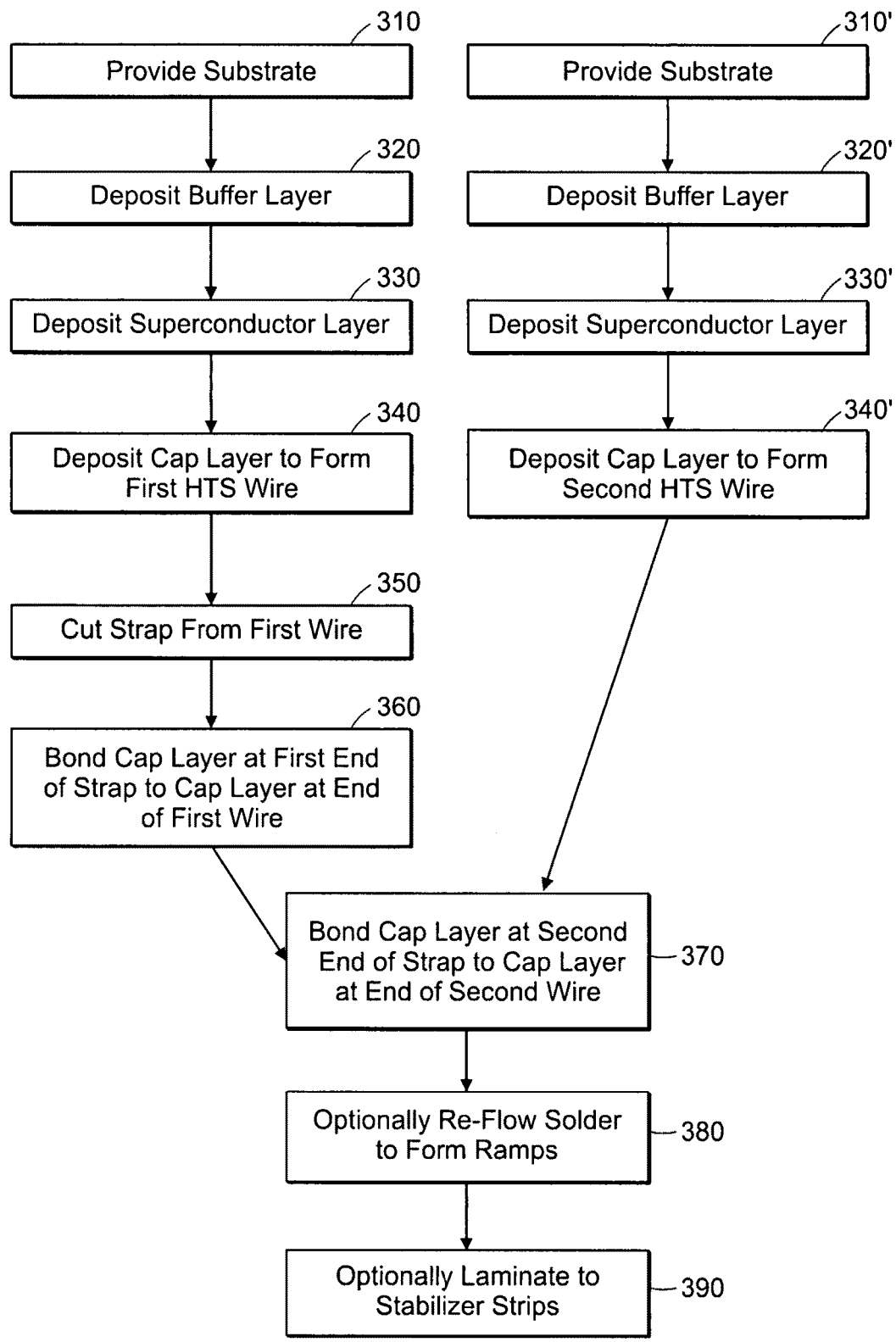
FIG. 3A is a flow chart of a method for fabricating two HTS wires and splicing them together with a conductive bridge according to one or more embodiments of the invention.

FIG. 3A illustrates an exemplary method for producing the joined HTS wires illustrated in FIGS. 2A-2D. First, the first HTS wire is fabricated. A substrate is provided (310); a buffer layer is deposited on the substrate (320); a superconductor layer is deposited on the buffer layer (330); and a cap layer is deposited over the superconductor layer (340). Separately, the second HTS wire is fabricated by providing a substrate (310'); depositing a buffer layer on the substrate (320'); depositing a superconductor layer on the buffer layer (330'); and depositing a cap layer over the superconductor layer (340').

Next, a conductive bridge is cut from the first wire (350). In other embodiments, the conductive bridge is provided from a third HTS wire. The length of the conductive bridge is selected to provide a satisfactory electrical resistance over the entire length of the joint. As mentioned above, the end of the conductive bridge and/or the first wire may be cut so as to mitigate the formation of burrs, as well as to reduce stress in the joint, e.g., by cutting the ends on a diagonal. Next, the cap layer at the first end of the conductive bridge is bonded to the cap layer at the end of the first wire (360). This is done by wetting the first end of the conductive bridge with solder, wetting the end of the first wire with solder, and pressing the two together, e.g., in a die. Next, the cap layer at the second end of the conductive bridge is similarly bonded to the cap layer at the end of the second wire (370). The solder is then optionally re-flowed to form edge seals such as those illustrated in FIGS. 2A and 2C (380). Next, the resulting assembly is optionally laminated to stabilizer strips, forming a substantially sealed and mechanically stabilized wire such as that illustrated in FIGS. 2C-2D. Lateral and through-tape alignment of the overlap at each of tape end is maintained during splice soldering and re-flow by edge guides or channels, as well as a sled or pressure bar or fixture for the top and bottom surfaces. The conductive bridge tape and the two end regions of the spliced tape are aligned in the lateral direction through the joint to within about 2 degrees of divergence from the conductive bridge axis line.

If the first and/or second HTS wires and/or conductive bridge are reinforced with a stabilizer strip laminated to the cap layer, the splice and re-flow temperatures are kept below the incipient melting temperature of the material that laminates the stabilizer strip to the cap layer, e.g., solder or its related phases formed from solder interaction with the cap layer and the stabilizer strip.

If desired, or sealing material such as an electrically insulating coating, can be applied to one or both sides of the spliced wire, or completely surrounding the spliced wire.

Figure 3B:
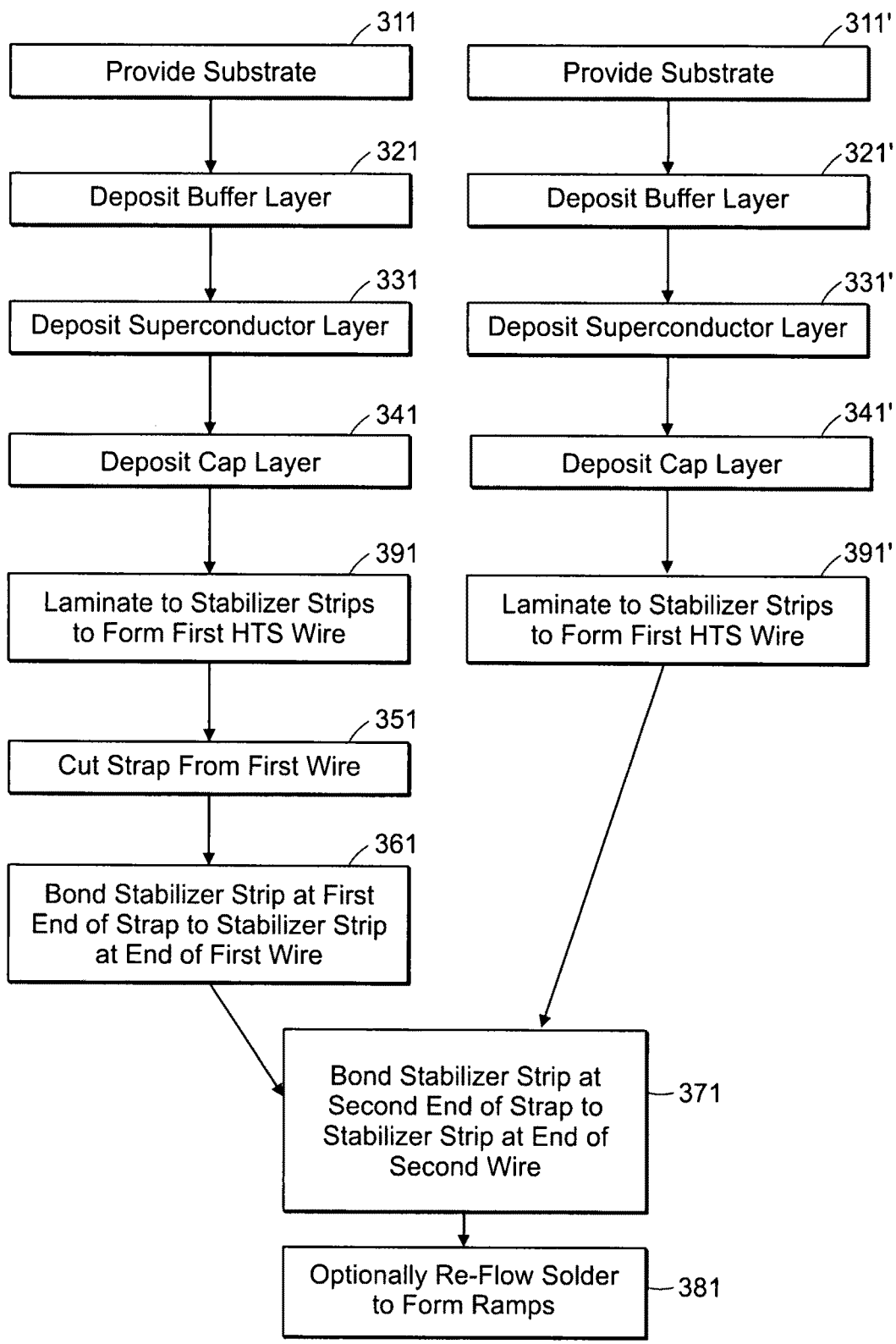
FIG. 3B is a flow chart of a method for fabricating two HTS wires and splicing them together with a conductive bridge according to one or more embodiments of the invention.

FIG. 3B illustrates an exemplary method for producing the joined HTS wire illustrated in FIGS. 2E-2F. First, the first HTS wire is fabricated. A substrate is provided (311); a buffer layer is deposited on the substrate (321); a superconductor layer is deposited on the buffer layer (331); a cap layer is deposited over the superconductor layer (341), and the resulting assembly is laminated to stabilizer strips (391). Separately, the second HTS wire is fabricated by providing a substrate (311'); depositing a buffer layer on the substrate (321'); depositing a superconductor layer on the buffer layer (331'); depositing a cap layer over the superconductor layer (340'), and the resulting assembly is laminated to stabilizer strips (391').

Next, a conductive bridge is cut from the first wire (351). In other embodiments, the conductive bridge is provided from a third HTS wire. The length of the conductive bridge is selected to provide a satisfactory electrical resistance over the entire length of the joint. As mentioned above, the end of the conductive bridge and/or the first wire may be cut so as to mitigate the formation of burrs, as well as to reduce stress in the joint, e.g., by cutting the ends on a diagonal. Next, the stabilizer strip at the first end of the conductive bridge is bonded to the stabilizer strip at the end of the first wire (361). This is done by wetting the first end of the conductive bridge with solder, wetting the end of the first wire with solder, and pressing the two together, e.g., in a die. Next, the stabilizer strip at the second end of the conductive bridge is similarly bonded to the stabilizer strip at the end of the second wire (371). The solder is then optionally re-flowed to form edge seals such as those illustrated in FIGS. 2E and 2F (381). As mentioned above, lateral and through-tape alignment of the overlap at each of tape end is maintained during splice soldering and re-flow by edge guides or channels, as well as a sled or pressure bar or fixture for the top and bottom surfaces. The conductive bridge tape and the two end regions of the spliced tape are aligned in the lateral direction through the joint to within about 2 degrees of divergence from the conductive bridge axis line.

In general, the steps of the method can be executed in a different order than that given. For example, the conductive bridge could be simultaneously bonded to both wires. Or, the conductive bridge could be cut from the second wire, or could come from a separate wire, which could be different from either of the first or second HTS wires. The steps of the method can be performed manually and/or automatically. For example, cutting the ends of the wires can be performed manually, and pressing the solder-wetted conductive bridge and wire(s) together can be performed automatically, e.g., in a die. Note also that the joint need not solely be used to join two separately fabricated wires; the joint is also useful for repairing a break in a single wire, or generally for providing a low-resistance electrical connection between any two coated conductor HTS wires.

A method for making an YBCO HTS wire that can be joined using the methods described herein is described. Other kinds of HTS wires can be joined using the methods described herein, and the conductive bridge, first wire, and second wire need not be identical. For example the HTS wire can be a bismuth-strontium-calcium copper oxide (BSCCO) superconductor or a MgB superconductor.

Fabricating and Splicing HTS Wires

Figure 4:
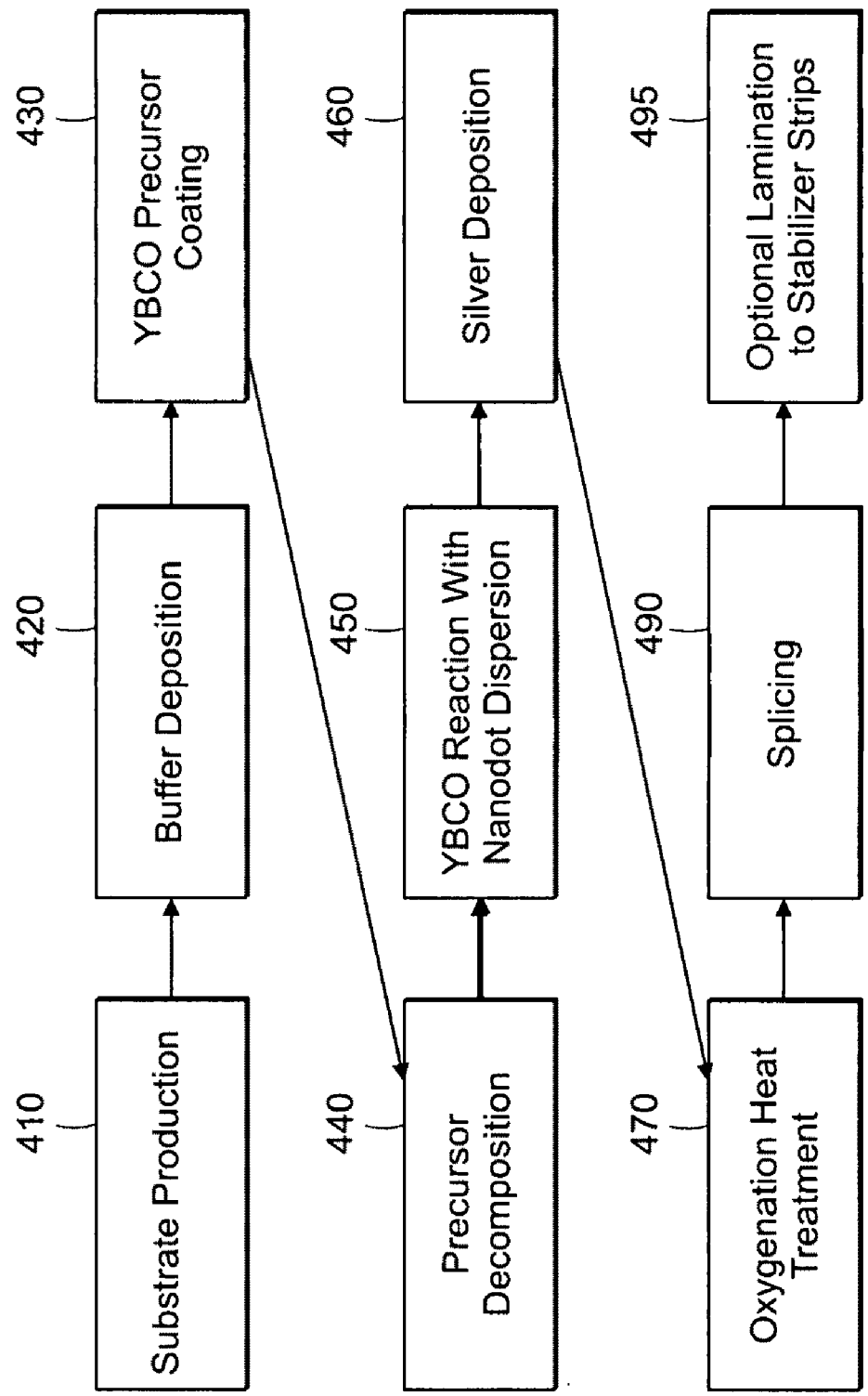
FIG. 4 is a schematic illustration of a system and process used to prepare a spliced HTS wire according to one or more embodiments of the invention.

A web coating method of fabricating wires having the architecture $CeO_2/YSZ/Y_2O_3/NiW$ is shown in FIG. 4.

Textured Metal Substrate

The template is provided in widths of about 1 to 10 cm, or larger. Optionally, it is textured. A method of preparing a textured metal substrate suitable for use as a substrate for an HTS wire first is described. At a first station 410, a substrate is treated to obtain biaxial texture. Preferably, the substrate surface has a relatively well-defined crystallographic orientation. For example, the surface can be a biaxially textured surface (e.g., a (113)[211] surface) or a cube textured surface (e.g., a (100)[011] surface or a (100)[001] surface). Preferably, the peaks in an X-ray diffraction pole figure of surface 110 have a FWHM of less than about 20° (e.g., less than about 15°, less than about 10°, or from about 5° to about 10°).

The surface of the substrate can be prepared, for example, by rolling and annealing. Surfaces can also be prepared using vacuum processes, such as ion beam assisted deposition, inclined substrate deposition and other vacuum techniques known in the art to form a biaxially textured surface on, for example, a randomly oriented polycrystalline surface. In certain embodiments (e.g., when ion beam assisted deposition is used), the surface of the substrate need not be textured (e.g., the surface can be randomly oriented polycrystalline, or the surface can be amorphous).

The substrate can be formed of any material capable of supporting a buffer layer stack and/or a layer of superconductor material. Examples of substrate materials that can be used as the substrate include for example, metals and/or alloys, such as nickel, silver, copper, zinc, aluminum, iron, chromium, vanadium, palladium, molybdenum and/or their alloys. In some embodiments, the substrate can be formed of a superalloy. In certain embodiments, the substrate can be in the form of an object having a relatively large surface area (e.g., a tape or a wafer). In these embodiments, the substrate is preferably formed of a relatively flexible material.

In some of these embodiments, the substrate is a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities).

In certain of these embodiments, the substrate contains more than two metals (e.g., a ternary alloy or a quaternary alloy). In some of these embodiments, the alloy can contain one or more oxide formers (e.g., Mg, Al, Ti, Cr, Ga, Ge, Zr, Hf, Y, Si, Pr, Eu, Gd, Th, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. In certain of these embodiments, the alloy can contain two of the following metals: copper, nickel, chromium, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g., annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g., Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

In some embodiments, stable oxide formation at the surface can be mitigated until a first epitaxial (for example, buffer) layer is formed on the biaxially textured alloy surface, using an intermediate layer disposed on the surface of the substrate. Intermediate layers include those epitaxial metal or alloy layers that do not form surface oxides when exposed to conditions as established by $PO_2$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the substrate in a surface treatment. The sulfur can be formed on the surface of the substrate, for example, by exposing the intermediate layer to a gas environment containing a source of sulfur (e.g., $H_2S$) and hydrogen (e.g., hydrogen, or a mix of hydrogen and an inert gas, such as a 5% hydrogen/argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850° C.). The pressure of the hydrogen (or hydrogen/inert gas mixture) can be relatively low (e.g., less than about one torr, less than about $1\times10^{-3}$ torr, less than about $1\times10^{-6}$ torr) or relatively high (e.g., greater than about 1 torr, greater than about 100 torr, greater than about 760 torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., c(2×2)) can be formed by applying an appropriate organic solution to the surface of the intermediate layer by heating to an appropriate temperature in an appropriate gas environment. It can also be obtained by allowing sulfur, which can be added to the substrate material, to diffuse to the surface of the substrate.

Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface.

The substrate may also be untextured, for example, using Hastelloy or other commercial metals.

Buffer Layer

In a second processing station 420, a buffer layer is formed on the textured substrate.

Examples of buffer materials include metals and metal oxides, such as silver, nickel, TbO, $CeO_2$, yttria-stabilized zirconia (YSZ), $Y_2O_3$, $Gd_2O_3$, $LaAlO_3$, $SrTiO_3$, $LaNiO_3$, LaCuO.sub.3, $SrRuO_3$, $NdGaO_3$, $NdAlO_3$ and/or nitrides as known to those skilled in the art.

In certain embodiments, an epitaxial buffer layer can be formed using a low vacuum vapor deposition process (e.g., a process performed at a pressure of at least about $1\times10^3$ torr). The process can include forming the epitaxial layer using a relatively high velocity and/or focused gas beam of buffer layer material.

The buffer layer material in the gas beam can have a velocity of greater than about one meter per second (e.g., greater than about 10 meters per second or greater than about 100 meters per second). At least about 50% of the buffer layer material in the beam can be incident on the target surface (e.g., at least about 75% of the buffer layer material in the beam can be incident on the target surface, or at least about 90% of the buffer layer material in the beam can be incident on the target surface).

The method can include placing a target surface (e.g., a substrate surface or a buffer layer surface) in a low vacuum environment, and heating the target surface to a temperature which is greater than the threshold temperature for forming an epitaxial layer of the desired material on the target surface in a high vacuum environment (e.g., less than about $1\times10^{-3}$ torr, such as less than about 1×10⁻⁴ torr) under otherwise identical conditions. A gas beam containing the buffer layer material and optionally an inert carrier gas is directed at the target surface at a velocity of at least about one meter per second. A conditioning gas is provided in the low vacuum environment. The conditioning gas can be contained in the gas beam, or the conditioning gas can be introduced into the low vacuum environment in a different manner (e.g., leaked into the environment). The conditioning gas can react with species (e.g., contaminants) present at the target surface to remove the species, which can promote the nucleation of the epitaxial buffer layer.

The epitaxial buffer layer can be grown on a target surface using a low vacuum (e.g., at least about 1×10⁻³ torr, at least about 0.1 torr, or at least about 1 torr) at a surface temperature below the temperature used to grow the epitaxial layer using physical vapor deposition at a high vacuum (e.g., at most about 1×10⁻⁴ torr). The temperature of the target surface can be, for example, from about 25° C. to about 800° C. (e.g., from about 500° C. to about 800° C., or from about 500° C. to about 650° C.).

The epitaxial layer can be grown at a relatively fast rate, such as, for example, at least about 50 Angstroms per second.

These methods are described in U.S. Pat. No. 6,027,564, issued Feb. 22, 2000, and entitled "Low Vacuum Process for Producing Epitaxial Layers;" U.S. Pat. No. 6,022,832, issued Feb. 8, 2000, and entitled "Low Vacuum Process for Producing Superconductor Articles with Epitaxial Layers;" and/or commonly owned U.S. patent application Ser. No. 09/007,372 filed Jan. 15, 1998, and entitled "Low Vacuum Process for Producing Epitaxial Layers of Semiconductor Material," all of which are hereby incorporated by reference.

In some embodiments, an epitaxial buffer layer can be deposited by sputtering from a metal or metal oxide target at a high throughput. Heating of the substrate can be accomplished by resistive heating or bias and electric potential to obtain an epitaxial morphology. A deposition dwell may be used to form an oxide epitaxial film from a metal or metal oxide target.

The oxide layer typically present on substrates can be removed by exposure of the substrate surface to energetic ions within a reducing environment, also known as Ion Beam etching. Ion Beam etching can be used to clean the substrate prior to film deposition, by removing residual oxide or impurities from the substrate, and producing an essentially oxide-free preferably biaxially textured substrate surface. This improves the contact between the substrate and subsequently deposited material. Energetic ions can be produced by various ion guns, for example, which accelerate ions such as $Ar^+$ toward a substrate surface. Preferably, gridded ion sources with beam voltages greater than 150 eV are utilized. Alternatively, a plasma can be established in a region near the substrate surface. Within this region, ions chemically interact with a substrate surface to remove material from that surface, including metal oxides, to produce substantially oxide-free metal surface.

Another method to remove oxide layers from a substrate is to electrically bias the substrate. If the substrate is made negative with respect to the anode potential, it will be subjected to a steady bombardment by ions from the gas prior to the deposition (if the target is shuttered) or during the entire film deposition. This ion bombardment can clean the substrate surface of absorbed gases that might otherwise be incorporated in the film and also heat the substrate to elevated deposition temperatures. Such ion bombardment can be further advantageous by improving the density or smoothness of the epitaxial film.

Upon formation of an appropriately textured, substantially oxide-free substrate surface, deposition of a buffer layer can begin. One or more buffer layers, each including a single metal or oxide layer, can be used. In some preferred embodiments, the substrate is allowed to pass through an apparatus adapted to carry out steps of the deposition method of these embodiments. For example, if the substrate is in the form of a tape, the substrate can be passed linearly from a payout reel to a take-up reel, and steps can be performed on the substrate as it passes between the reels.

According to some embodiments, substrate materials are heated to elevated temperatures which are less than about 90% of the melting point of the substrate material but greater than the threshold temperature for forming an epitaxial layer of the desired material on the substrate material in a vacuum environment at the predetermined deposition rate. In order to form the appropriate buffer layer crystal structure and buffer layer smoothness, high substrate temperatures are generally preferred. Typical lower limit temperatures for the growth of oxide layers on metal are approximately 200° C. to 800° C., preferably 500° C. to 800° C., and more preferably, 650° C. to 800° C. Various well-known methods such as radiative heating, convection heating, and conduction heating are suitable for short (2 cm to 10 cm) lengths of substrate, but for longer (1 m to 100 m) lengths, these techniques may not be well suited. Also to obtain desired high throughput rates in a manufacturing process, the substrate must be moving or transferring between deposition stations during the process. According to particular embodiments, the substrates are heated by resistive heating, that is, by passing a current through the metal substrate, which is easily scaleable to long length manufacturing processes. This approach works well while instantaneously allowing for rapid travel between these zones. Temperature control can be accomplished by using optical pyrometers and closed loop feedback systems to control the power supplied to the substrate being heated. Current can be supplied to the substrate by electrodes that contact the substrate in at least two different segments of the substrate. For example, if the substrate, in the form of a tape, is passed between reels, the reels themselves could act as electrodes. Alternatively, if guides are employed to transfer the substrate between reels, the guides could act as electrodes. The electrodes could also be completely independent of any guides or reels as well. In some preferred embodiments, current is applied to the substrate tape between current wheels.

In order that the deposition is carried out on a substrate that is at the appropriate temperature, the metal or oxide material that is deposited onto the substrate is desirably deposited in a region between the current wheels. Because the current wheels can be efficient heat sinks and can thus cool the tape in regions proximate to the wheels, material is desirably not deposited in regions proximate to the wheels. In the case of sputtering, the charged material deposited onto the substrate is desirably not influenced by other charged surfaces or materials proximate to the sputter flux path. For this reason, the sputter chamber is preferably configured to place components and surfaces which could influence or deflect the sputter flux, including chamber walls, and other deposition elements, in locations distant from the deposition zone so that they do not alter the desired linear flux path and deposition of metal or metal oxide in regions of the tape at the proper deposition temperature.

More details are provided in commonly owned U.S. patent application Ser. No. 09/500,701, filed on Feb. 9, 2000, and entitled "Oxide Layer Method," and commonly owned U.S. patent application Ser. No. 0/615,669, filed on Jul. 14, 2000, and entitled "Oxide Layer Method," both of which are hereby incorporated by reference in their entirety.

In preferred embodiments, three buffer layers are used. A layer of $Y_2O_3$ or $CeO_2$ (e.g., from about 20 nanometers to about 75 nanometers thick) is deposited (e.g., using electron beam evaporation) onto the substrate surface. A layer of YSZ (e.g., from about 0.20 nanometers about 700 nanometers thick, such as about 75 nanometers thick) is deposited onto the surface of the $Y_2O_3$ or $CeO_2$ layer using sputtering (e.g., using magnetron sputtering). A $CeO_2$ layer (e.g., about 20 nanometers thick) is deposited (e.g., using magnetron sputtering) onto the YSZ surface. The surface of one or more of these layers can be chemically and/or thermally conditioned as described herein.

In certain embodiments, a buffer layer material can be prepared using solution phase techniques, including metalorganic deposition, which are known to those skilled in the art. Such techniques are disclosed in, for example, S. S. Shoup et al., J. Am. Cer. Soc., Vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527.

In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

In certain embodiments, the buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

The formation of oxide buffer layers can be carried out so as to promote wetting of an underlying substrate layer. Additionally, in particular embodiments, the formation of metal oxide layers can be carried out using metal alkoxide or carboxylate precursors (for example, "sol gel" precursors).

As described above, if desired, the buffer layer or layers can be patterned either during or subsequent to their deposition.

Precursor Layer

Once the textured substrate including buffer layers is prepared, a precursor solution is deposited at a station 430 as described above. One or more layers are deposited to form a precursor layer having the desired thickness and overall composition.

Suitable precursor components include soluble compounds of one or more rare earth elements, one or more alkaline earth metals and one or more transition metals. As used herein, "soluble compounds" of rare earth elements, alkaline earth metals and transition metals refers to compounds of these metals that are capable of dissolving in the solvents contained in the precursor solution. Such compounds include, for example, salts (e.g., nitrates, acetates, alkoxides, halides, sulfates, and trifluoroacetates), oxides and hydroxides of these metals. At least one of the compounds is a fluorine-containing compound, such as the trifluoroacetate.

Examples of metal salt solutions that can be used are as follows.

In some embodiments, the metal salt solution can have a relatively small amount of free acid. In aqueous solutions, this can correspond to a metal salt solution with a relatively neutral pH (e.g., neither strongly acidic nor strongly basic). The metal salt solution can be used to prepare multi-layer superconductors using a wide variety of materials that can be used as the underlying layer on which the superconductor layer is formed.

The total free acid concentration of the metal salt solution can be less than about $1\times10^{-3}$ molar (e.g., less than about $1\times10^{-5}$ molar or about $1\times10^{-7}$ molar). Examples of free acids that can be contained in a metal salt solution include trifluoroacetic acid, acetic acid, nitric acid, sulfuric acid, acids of iodides, acids of bromides and acids of sulfates.

When the metal salt solution contains water, the precursor composition can have a pH of at least about 3 (e.g., at least about 5 or about 7).

In some embodiments, the metal salt solution can have a relatively low water content (e.g., less than about 50 volume percent water, less than about 35 volume percent water, less than about 25 volume percent water).

In general, the rare earth metal salt can be any rare earth metal salt that is soluble in the solvent(s) contained in the precursor solution and that, when being processed to form an intermediate (e.g., a metal oxyhalide intermediate), forms rare earth oxide(s) (e.g., $Y_2O_3$). The rare earth elements may be selected from the group of yttrium, cerium, neodymium, samarium, europium, gadolinium, terbium, dysprosium, holmium, erbium, thulium, ytterbium, and lutetium. Typically, the alkaline earth metal is barium, strontium or calcium. Such salts can have, for example, the formula $M(O_2C-(CH_2)_n-CXX'X'')(O_2C-(CH_2)_m-CX'''X''''X''''')(O_2C-(CH_2)_p-CX''''''X'''''''X'''''''')$ or $M(OR)_3$. M is the rare earth metal. n, m and p are each at least one but less than a number that renders the salt insoluble in the solvent(s) (e.g., from one to ten). Each of X, X', X", X"', X"", X""', X"""', X"""" and X""""" is H, F, Cl, Br or I. R is a carbon containing group, which can be halogenated (e.g., $CH_2CF_3$) or nonhalogenated. Examples of such salts include nonhalogenated carboxylates, halogenated acetates (e.g., trifluoroacetate, trichloroacetate, tribromoacetate, triiodoacetate), halogenated alkoxides, and nonhalogenated alkoxides. Examples of such nonhalogenated carboxylates include nonhalogenated acetates (e.g., $M(O_2C-CH_3)_3$). Generally, the alkaline earth metal salt can be any alkaline earth metal salt that is soluble in the solvent(s) contained in the precursor solution and that, when being processed to form an intermediate (e.g., a metal oxyhalide intermediate), forms an alkaline earth halide compound (e.g., $BaF_2$, $BaCl_2$, $BaBr_2$, $BaI_2$) prior to forming alkaline earth oxide(s) (e.g., BaO). Such salts can have, for example, the formula $M'(O_2C-(CH_2)_n-CXX'X")(O_2C-(CH_2)_m-CX'''X''''X''''')$ or $M'(OR)_2$. M' is the alkaline earth metal. n and m are each at least one but less than a number that renders the salt insoluble in the solvent(s) (e.g., from one to ten). Each of X, X', X", X"', X"" and X""' is H, F, Cl, B or, I. R can be a halogenated or nonhalogenated carbon containing group. Examples of such salts include halogenated acetates (e.g., trifluoroacetate, trichloroacetate, tribromoacetate, triiodoacetate). Generally, the transition metal is copper. The transition metal salt should be soluble in the solvent(s) contained in the precursor solution. In one or more embodiments of the present invention, the rare earth and the alkaline earth elements can form a metal or mixed metal oxyfluoride in place of or in addition to a rare earth oxide and an alkaline earth fluoride.

Suitable copper precursor solutions contain a copper salt that is soluble at the appropriate concentration in the solvent(s). Such compounds include copper nitrates, carboxylates, alkoxides, halides, sulfates or trifluoroacetates. Preferably, during conversion of the precursor to the intermediate (e.g., metal oxyhalide), minimal cross-linking occurs between discrete transition metal molecules (e.g., copper molecules). Such transition metals salts can have, for example, the formula $M"(CXX'X"-CO(CH)_aCO-CX'''X''''X''''')(CX''''''X'''''''X''''''''-CO(CH)_bCO CX'''''''''X''''''''''X''''''''''')$, $M"(O_2C-(CH_2)_n-CXX'X")(O_2C-(CH_2)_m-CX'''X''''X''''')$ or $M"(OR)_2$. M" is the transition metal. a and b are each at least one but less than a number that renders the salt insoluble in the solvent(s) (e.g., from one to five). Generally, n and m are each at least one but less than a number that renders the salt insoluble in the solvent(s) (e.g., from one to ten). Each of X, X', X", X"', X"", X""', X"""', X""""', X"""""', X"""""", X""""""' is H, F, Cl, Br or I. R is a carbon containing group, which can be halogenated (e.g., $CH_2CF_3$) or nonhalogenated. These salts include, for example, nonhalogenated acetates (e.g., $M"(O_2C-CH_3)_2$), halogenated acetates, halogenated alkoxides, and nonhalogenated alkoxides. Examples of such salts include copper trichloroacetate, copper tribromoacetate, copper triiodoacetate, $Cu(CH_3COCHCOCF_3)_2$, $Cu(OOCC_7H_{15})_2$, $Cu(CF_3COCHCOF_3)_2$, $Cu(CH_3COCHCOCH_3)_2$, $Cu(CH_3CH_2CO_2CHCOCH_3)_2$, $CuO(C_5H_6N)_2$ and $Cu_3O_3Ba_2(O-CH_2CF_3)_4$. A suitable compound is copper proprionate. An example of a nonhalogenated propionate salt of a transition metal is $Cu(O_2CC_2H_5)_2$. In some embodiments, the transition metal salt is a simple salt, such as copper sulfate, copper nitrate, copper iodide and/or copper oxylate. In some embodiments, n and/or m can have the value zero. In certain embodiments, a and/or b can have the value zero. An illustrative and non-limiting list of Lewis bases includes nitrogen-containing compounds, such as ammonia and amines.

Examples of amines include $CH_3CN$, $C_5H_5N$ and $R_1R_2R_3N$. Each of $R_1R_2R_3$ is independently H, an alkyl group (e.g., a straight chained alkyl group, a branched alkyl group, an aliphatic alkyl group, a non-aliphatic alkyl group and/or a substituted alkyl group) or the like. Without wishing to be bound by theory, it is believed that the presence of a Lewis base in the metal salt solution can reduce cross-linking of copper during intermediate formation. It is believed that this is achieved because a Lewis base can coordinate (e.g., selective coordinate) with copper ions, thereby reducing the ability of copper to cross-link.

While the precursor solution typically contains stoichiometric amounts of the component metal compounds, i.e., 3:2:1 Cu:Ba:RE, in some embodiments an excess of copper or a deficiency of barium is used. The ratio of the transition metal to the alkaline earth metal can be greater than 1.5, and the precursor solution can include at least about 5 mol % excess copper, or at least about 20 mol % excess copper.

In addition to precursor components for the formation of a rare-earth/alkaline-earth-metal/transition-metal oxide, the precursor solution may include additive components and/or dopant components for the formation of flux pinning sites is used in a solution-based method to obtain a superconducting film having pinning centers. The additive compound can be metal compounds, such as soluble compounds of rare earths, alkaline earths or transition metals, cerium, zirconium, silver, aluminum, or magnesium, that form metal oxide or metal in the oxide superconductor film. The precursor solution can provide a dopant metal that partially substitutes for a metal of the precursor component of the precursor solution. Generally, a dopant component can be any metal compound that is soluble in the solvent(s) contained in the precursor solution and that, when processed to form an oxide superconductor, provided a dopant metal that substitutes for an element of the oxide superconductor.

The solvent or combination of solvents used in the precursor solution can include any solvent or combination of solvents capable of dissolving the metal salts (e.g., metal carboxylate(s)). Such solvents include, for example, alcohols or acids, including methanol, ethanol, isopropanol and butanol, propionic acid or water.

In embodiments in which the metal salt solution contains trifluoroacetate ion and an alkaline earth metal cation (e.g., barium), the total amount of trifluoroacetate ion can be selected so that the mole ratio of fluorine contained in the metal salt solution (e.g., in the form of trifluoroacetate) to the alkaline earth metal (e.g., barium ions) contained in the metal salt solution is at least about 2:1 (e.g., from about 2:1 to about 18.5:1, or from about 2:1 to about 10:1).

The methods of disposing the superconducting composition on the underlying layer (e.g., on a surface of a substrate, such as a substrate having an alloy layer with one or more buffer layers disposed thereon) include spin coating, dip coating, slot coating, web coating and other techniques known in the art.

Decomposition of the Precursor Layer

At a subsequent station 440, the precursor components are decomposed. The conversion of the precursor components into an oxide superconductor is carried out as has been previously reported for continuous thick precursor films. In the case of precursor components including at least one fluoride-containing salt, the first step of the heating step is performed to decompose the metalorganic molecules to one or more oxyfluoride intermediates of the desired superconductor material.

An intermediate oxyfluoride film is considered to be any film that is a precursor to a rare earth metal-alkaline earth metal-transition metal oxide superconductor (hereinafter "RE-123") film that is comprised of (1) a mixture of $BaF_2$, a rare earth oxide or fluoride and/or transition metal, transition metal oxide or transition metal fluoride, (2) a mixture of a compound comprised of a RE-Ba—O—F phase, a rare earth oxide or fluoride and/or transition metal oxide or fluoride, or (3) as a mixture of a compound comprised of a Ba—O—F phase, rare earth oxides or fluorides and/or transition metal oxide or fluoride. The intermediate film can then be further processed to form a RE-123 oxide superconductor film. The oxide superconductor film also indicates a small, but detectable, fluoride residue.

Typically, the initial temperature in this step is about room temperature, and the final temperature is from about 190° C. to about 210° C., preferably to a temperature to about 200° C. Preferably, this step is performed using a temperature ramp of at least about 5° C. per minute, more preferably a temperature ramp of at least about 10° C. per minute, and most preferably a temperature ramp of at least about 15° C. per minute. During this step, the partial pressure of water vapor in the nominal gas environment is preferably maintained at from about 5 torr to about 50 torr, more preferably at from about 5 torr to about 30 torr, and most preferably at from about 20 torr to about 30 torr. The partial pressure of oxygen in the nominal gas environment is maintained at from about 0.1 torr to about 760 torr and preferably at about 730-740 torr.

Heating is then continued to a temperature of from about 200° C. to about 290° C. using a temperature ramp of from about 0.05° C. per minute to about 5° C. per minute (e.g., from about 0.5° C. per minute to about 1° C. per minute). Preferably, the gas environment during this heating step is substantially the same as the nominal gas environment used when the sample is heated to from the initial temperature to from about 190° C. to about 215° C.

Heating is further continued to a temperature of about 650° C., or more preferably to a temperature of about 400° C., to form the oxyfluoride intermediate. This step is preferably performed using a temperature ramp of at least about 2° C. per minute, more preferably at least about 3° C. per minute, and most preferably at least about 5° C. per minute. Preferably, the gas environment during this heating step is substantially the same as the nominal gas environment used when the sample is heated to from the initial temperature to from about 190° C. to about 215° C.

In alternate embodiments, barium fluoride is formed by heating the dried solution from an initial temperature (e.g., room temperature) to a temperature of from about 190° C. to about 215° C. (e.g., about 210° C.) in a water vapor pressure of from about 5 torr to about 50 torr water vapor (e.g., from about 5 torr to about 30 torr water vapor, or from about 10 torr to about 25 torr water vapor). The nominal partial pressure of oxygen can be, for example, from about 0.1 torr to about 760 torr. In these embodiments, heating is then continued to a temperature of from about 220° C. to about 290° C. (e.g., about 220° C.) in a water vapor pressure of from about 5 torr to about 50 torr water vapor (e.g., from about 5 torr to about 30 torr water vapor, or from about 10 torr to about 25 torr water vapor). The nominal partial pressure of oxygen can be, for example, from about 0.1 torr to about 760 torr. This is followed by heating to about 400° C. at a rate of at least about 2° C. per minute (e.g., at least about 3° C. per minute, or at least about 5° C. per minute) in a water vapor pressure of from about 5 torr to about 50 torr water vapor (e.g., from about 5 torr to about 30 torr water vapor, or from about 10 torr to about 25 torr water vapor) to form barium fluoride. The nominal partial pressure of oxygen can be, for example, from about 0.1 torr to about 760 torr.

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 torr, a predetermined partial pressure of water vapor (e.g. at least about 10 torr, at least about 15 torr, at most about 25 torr, at most about 20 torr, about 17 torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

The foregoing treatments of a metal salt solution can result in an oxyfluoride intermediate film in which the constituent metal oxides and metal fluorides are homogeneously distributed throughout the film. Preferably, the precursor has a relatively low defect density and is essentially free of cracks through the intermediate thickness. While solution chemistry for barium fluoride formation has been disclosed, other methods can also be used for other precursor solutions.

Forming the Oxide Superconductor

The superconductor intermediate film can then be heated to form the desired superconductor layer at a further processing station 450. Typically, this step is performed by heating from about room temperature to a temperature of from about 700° C. to about 825° C., preferably to a temperature of about 740° C. to 800° C. and more preferably to a temperature of about 750° C. to about 790° C., at a temperature ramp of about greater than 25° C. per minute, preferably at a temperature rate of about greater than 100° C. per minute and more preferably at a temperature rate about greater than 200° C. per minute. This step can also start from the final temperature of about 400-650° C. used to form the intermediate oxyfluoride film. During this step, a process gas is flowed over the film surface to supply the gaseous reactants to the film and to remove the gaseous reaction products from the film. The nominal gas environment during this step has a total pressure of about 0.1 torr to about 760 torr and is comprised of about 0.09 torr to about 50 torr oxygen and about 0.01 torr to about 150 torr water vapor and about 0 torr to about 750 torr of an inert gas (nitrogen or argon). More preferably, the nominal gas environment has a total pressure of about 0.15 torr to about 5 torr and includes about 0.1 torr to about 1 torr oxygen and about 0.05 torr to about 4 torr water vapor.

The film is then held at a temperature of about 700° C.-825° C., preferably at a temperature of about 740° C. to 800° C. and more preferably at a temperature of about 750° C. to about 790° C., for a time of about at least 5 minutes to about 120 minutes, preferably for a time of at least about 15 minutes to about 60 minutes, and more preferably for a time of at least about 15 minutes to about 30 minutes. During this step, a process gas is flowed over the film surface to supply the gaseous reactants to the film and to remove the gaseous reaction products from the film. The nominal gas environment during this step has a total pressure of about 0.1 torr to about 760 torr and is comprised of about 0.09 torr to about 50 torr oxygen and about 0.01 torr to about 150 torr water vapor and about 0 torr to about 750 torr of an inert gas (nitrogen or argon). More preferably, the nominal gas environment has a total pressure of about 0.15 torr to about 5 torr and is comprised of about 0.1 torr to about 1 torr oxygen and about 0.05 torr to about 4 torr water vapor.

The film is then cooled to room temperature in a nominal gas environment with an oxygen pressure of about 0.05 torr to about 150 torr, preferably about 0.1 torr to about 0.5 torr and more preferably from about 0.1 torr to about 0.2 torr.

The resultant superconductor layer is well ordered (e.g., biaxially textured in plane, or c-axis out of plane and biaxially textured in plane). In embodiments, the bulk of the superconductor material is biaxially textured. A superconductor layer can be at least about one micrometer thick (e.g., at least about two micrometers thick, at least about three micrometers thick, at least about four micrometers thick, at least about five micrometers thick). The oxide superconductor has a c-axis orientation that is substantially constant across its width, the c-axis orientation of the superconductor being substantially perpendicular to the surface of the wire or tape.

The superconductor layer can also be deposited in-situ (no precursor deposition and separate reaction steps) by laser ablation, MOCVD, or other techniques known in the art.

Further Processing

Further processing by cap layer deposition at station 460, oxygen anneal at station 470, and splicing to a second wire at station 490 are carried out. By splicing wires together using low resistance, mechanically robust joints, wires of length that is useable in a current carrying application without damage to the brittle oxide superconductor film are produced.

Assuming that the wires being joined were not previously laminated to stabilizer strips, the spliced wires can then optionally be laminated between stabilizer strips which can provide additional thermal and mechanical stability, as well as seal the wire to the environment. FIG. 3C illustrates an exemplary system and method that can be used to laminate stabilizer strips to a joined wire assembly such as that illustrated in FIGS. 2A and 2B, to result in a laminated joined wire assembly such as that illustrated in FIGS. 2C and 2D. The finished joined, laminated article is formed by feeding a joined wire assembly such as that illustrated in FIGS. 2A and 2B off of reel 810 into a bath of filler 890. A first stabilizer strip is fed off of reel 850, and a second stabilizer strip is fed off of reel 851, also into filler bath 890. The filler simultaneously surrounds the joined HTS wire being fed from reel 810, and also laminates it to the stabilizer strips being fed from reels 850 and 851. Die 830 merges and consolidates the wire and stabilizers into a finished superconducting wire such as that illustrated in FIGS. 2C and 2D.

Alternately, the system and method illustrated in FIG. 3C can be used to laminate stabilizer strips to individual HTS wires before they are spliced, resulting in an assembly such as that illustrated in FIGS. 2E and 2F. The system and method of FIG. 3C could be readily adapted for either purpose by one skilled in the art.

EXAMPLES

Low resistance conductive bridge splices were made with overlap lengths in the 10 to 20 cm range to connect reinforced YBCO coated conductor tapes (i.e., wires including stabilizer strips on either side of each segment of spliced wire, such as that illustrated in FIGS. 2E-2F). The exemplary spliced wires had either copper or stainless steel stabilizer strips, and were formed with a variety of solders, as described in greater detail below.

In general, the example conductive bridge splices exhibited total resistances well below the 200 nano-ohm target level at 7K (<100 nano ohm per lap joint). They were also found to be well aligned, robust and tolerate double bending below 100 cm diameter without exhibiting significant Ic degradation.

The following example outlines a process for making a 100 mm overlap strap splice. To make overlaps of various lengths replace 100 mm with the target length and change the solder amount proportionally. The pretin length will be 10 mm longer than the overlap length. Pretinning solder can be useful for making splices; pretinning can prepare the surfaces of the wires, thus improving the resulting mechanical and electrical bond.

Example Process Parameters for Making Strap Splice, Using Indium or In—Sn Solder Solder: Indium or In—Sn.
Soldering Iron temperature: 341° F. to 381° F.
Soldering Sled temperature: 164° C. to 179° C.
Solder Sled pressure: 5-25 pounds.
Strap Length: Greater than or equal to 0.1 m plus overlap length times 2. Typically a 0.7 meter strap length yields a strap splice overlap of 100 mm.

Example Procedure for Making a Strap Splice with a 100 mm Overlap Length, Using Indium or In—Sn Solder (1) Identify the HTS side of the two wires to be joined.
(2) Cut 0.7 meter section off one or the wires to make the strap.
(3) Write the wire number on the HTS side of both the wire and the strap.
(4) Apply flux to the HTS side of the wire.
(5) Using ~3/32" of 0.040" diameter Indium solder pretin the HTS side of the payoff wire for a length of 110 mm.
(6) Excess Indium should be left on the tip of the wire.
(7) Cut off the excess Indium. This will be a blob on the end of the wire.
(8) Place a 45° Chamfer on the end of the wire on both edges.
(9) Measure 100 mm from the tip of the wire and mark the wire on the untinned side.
(10) Repeat this process for both ends of the strap and the take-up wire.
(11) Place take up wire into the solder sled fixture with the HTS side up.
(12) Apply flux to the surface of the Take-up wire.
(13) Apply flux to the HTS side of the strap.
(14) Place the HTS side of the strap unto the HTS side of the take-up wire aligning the 100 mm mark with the tip of the take-up wire.
(15) Using the solder sled, solder the two pieces together according to work instructions.
(16) After the two sections are soldered together remove wire from solder sled fixture. One overlap is complete.
(17) Repeat steps 9 to 11 to solder the strap to the other wire. In this case the strap will be on the take-up side.

Example Process Parameters for Making Strap Splice Ramp, Using Indium Solder

Solder: Indium.
Soldering Iron temperature: 341° F. to 381° F.

Example Procedure for Making Ramps at Both Ends of the Overlap Joint, Using Indium Solder (1) Apply ~3/32" of 0.040" diameter Indium solder to the soldering iron.
(2) Then apply the soldering iron to the tip of the strap to form a ball of solder that spans the tip of the strap to the wire.

(3) The tip is held in place using an orange stick to make sure the strap tip does not rise off the wire.

(4) Soldering iron is held in place until the indium wets both the strap and the wire which takes ~30 seconds.

(5) Quickly remove soldering iron. At this point a ball of solder should span the step formed by the tip of the strap and the wire.

(6) At this point the excess solder is removed from the joint region. This is done using a knife held in such a way that the approach angle is 20° or less.

(7) The knife is then moved through the solder to create the ramp.

(8) Steps 1 to 7 are repeated 3 more times so that all wire ends are firmly attached to the base wire. This prevents the separation along the HTS layer under bend conditions. This also seals the end of the wire preventing the YBCO layer from reacting with water in the atmosphere and degrading.

The results presented below are for example splices made with tapes that were laminated with either copper or stainless steel stabilizer strips, with splice lengths from 25 mm to 200 mm long. The phrase "HTS to HTS overlap" is intended to mean that the HTS "sides" of two stabilized HTS wires are overlapped and spliced together as illustrated in FIGS. 2E and 2F, e.g., without a substrate interposed between the HTS layers of two joined stabilized wires. The phrase "HTS to substrate overlap" is intended to mean that the HTS "side" of one HTS wire is overlapped and spliced to the substrate "side" of another HTS wire, e.g., with a single substrate interposed between the HTS layers of two joined stabilized wires.

Electrical Results

HTS to HTS overlap resistance versus HTS to substrate overlap resistance is reported in Table 1 and in Table 2. These overlaps were made using YBCO-based HTS wires that were each stabilized with two copper stabilizer strips, and then spliced together. Individual measurements as well as statistics are given for each case. The HTS to HTS overlap has a resistance that is 80 times lower than the HTS to substrate overlap.

HTS to HTS overlaps were made with overlap lengths of 50, 100, 125, and 150 mm in length. These conditions are reported in Table 3. These overlaps were made using 4.4 mm wide YBCO-based HTS wires that were each stabilized with two stainless steel stabilizer strips, and then spliced together. Only HTS to HTS overlaps were made (no comparison of HTS to substrate overlap is provided).

Figure 5:
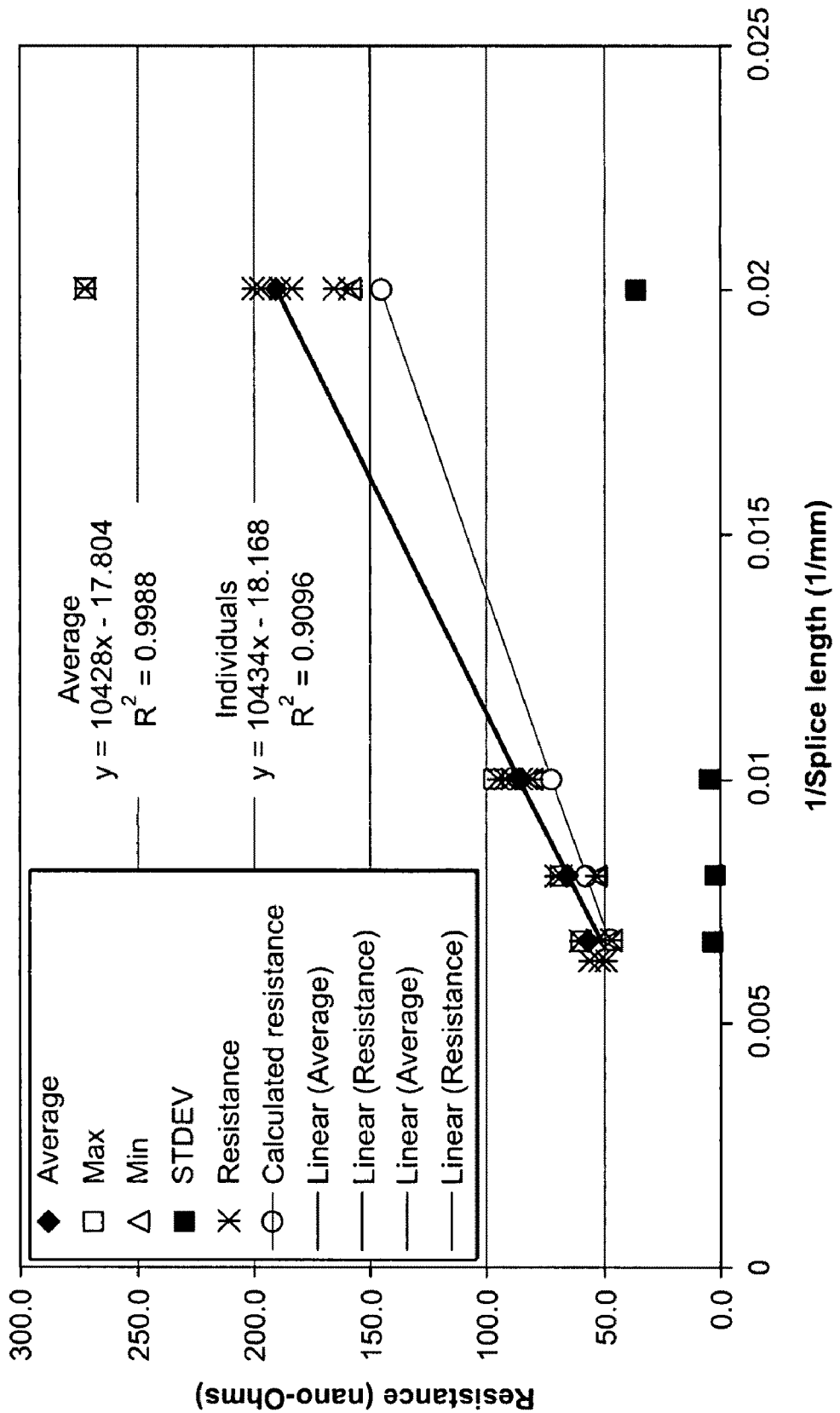
FIG. 5 is a plot of overlap length versus resistance for several example spliced HTS wires.

FIG. 5 shows the measured relationship of overlap length to resistance for joined HTS wires according to the embodiment of FIGS. 2E-2F, formed as described using the above example, using Indium solder to splice the wires together and with Pb—Sn solder bonding stainless steel stabilizer strips to each individual HTS wire. Results are plotted as 1/L, where L is the approximate overlap length. In general, the longer the splice (i.e., the smaller 1/L) the lower the measured resistance through the joint; and the shorter the splice (i.e., the larger 1/L) the higher the measured resistance through the joint. However, as can be seen in FIG. 5, the measured resistances are slightly higher than calculated values. This deviation may be caused by the alloying of the PB—Sn lamination solder with the Indium solder used to join the two elements together and/or deviations in lamination solder layer thickness and/or lamina thickness and/or wire width and/or overlap tolerances.

Table 4 shows the resistance of 125 mm overlaps made using various processing conditions. In—Sn solder results are also shown. As the data illustrate, the resistance levels are fairly robust to processing conditions.

TABLE 1

Processing conditions and resistance results for HTS to HTS overlaps made with copper laminated 4.4 mm wide tapes. Splice overlap length is 25 mm long. Strap length is 25 mm. Resistance is given in terms of nano-ohms pre overlap. A strap splice resistance is the sum of the two overlap resistances.

| Wire number | Splice Number | Set points Solder iron °F. | Set points Solder sled °C. | Ramps | Splice type | Resistance nano ohms |
|---|---|---|---|---|---|---|
| CC218-SL5-1 | 1 | 371 | 184 | Yes | F-F | 27 |
| | 2 | 371 | 184 | Yes | F-F | 23 |
| | 3 | 371 | 184 | Yes | F-F | 25 |
| | 4 | 371 | 184 | Yes | F-F | 33 |
| CC218-SL5-25 | 1 | 351 | 179 | Yes | F-F | 15 |
| | 2 | 351 | 179 | Yes | F-F | 20 |
| | 3 | 351 | 179 | Yes | F-F | 10 |
| | 4 | 351 | 179 | Yes | F-F | 17 |
| CC218-SL5-21 | 1 | 341 | 169 | No | F-F | 23 |
| | 2 | 341 | 169 | No | F-F | 13 |
| | 3 | 331 | 164 | No | F-F | 15 |
| | 4 | 331 | 164 | No | F-F | 20 |
| CC218-SL5-30 | 1 | 341 | 169 | Yes | F-F | 17 |
| | 2 | 341 | 169 | Yes | F-F | 22 |
| | 3 | 331 | 164 | Yes | F-F | 25 |
| | 4 | 331 | 164 | Yes | F-F | 26 |
| CC218-SL4-2 | 1 | 341 | 169 | Yes | F-F | 20 |
| | 2 | 341 | 169 | Yes | F-F | 25 |
| | 3 | 341 | 169 | Yes | F-F | 21 |
| | 4 | 341 | 169 | Yes | F-F | 21 |
| CC218-SL4-12 | 1 | 341 | 169 | No | F-F | 24 |
| | 2 | 341 | 169 | No | F-F | 23 |
| | 3 | 341 | 169 | No | F-F | 20 |
| | 4 | 341 | 169 | No | F-F | 16 |
| CC218-SL4-9 | 1 | 341 | 169 | Yes | F-F | 26 |
| | 2 | 341 | 169 | Yes | F-F | 43 |
| | 3 | 341 | 169 | Yes | F-F | 29 |
| | 4 | 341 | 169 | Yes | F-F | 32 |
| CC218-SL5-32 | 1 | 341 | 169 | Yes | F-F | 15 |
| | 2 | 341 | 169 | Yes | F-F | 30 |
| | 3 | 341 | 169 | Yes | F-F | 8 |
| | 4 | 341 | 169 | Yes | F-F | 22 |
| CC218-SL5-17 | 1 | 341 | 169 | Yes | F-F | 16 |
| | 2 | 341 | 169 | Yes | F-F | 41 |
| | 3 | 341 | 169 | Yes | F-F | 29 |
| | 4 | 341 | 169 | Yes | F-F | N/A |
| Average | | | | | | 22.6 |
| | | | | | | 8.0 |
| | | | | | | 43.0 |
| Stdev | | | | | | 7.6 |

TABLE 2

Processing conditions and resistance results for HTS to Substrate overlaps made with copper laminated 4.4 mm wide tapes. Splice overlap length is 25 mm long. Strap length is 75 mm. Resistance is given in terms of nano-ohms pre overlap. A strap splice resistance is the sum of the two overlap resistances.

| Wire number | Splice Number | Set points Solder iron °F. | Set points Solder sled °C. | Ramps | Splice type | Resistance nano ohms |
|---|---|---|---|---|---|---|
| CC218-SL5-8 | 1 | 371 | 184 | Yes | F-B | 1498 |
| | 2 | 371 | 184 | Yes | F-B | 1478 |
| | 3 | 371 | 184 | Yes | F-B | 1430 |
| | 4 | 371 | 184 | Yes | F-B | 1409 |

TABLE 2-continued

Processing conditions and resistance results for HTS to Substrate overlaps made with copper laminated 4.4 mm wide tapes. Splice overlap length is 25 mm long. Strap length is 75 mm. Resistance is given in terms of nano-ohms pre overlap. A strap splice resistance is the sum of the two overlap resistances.

| Wire number | Splice Number | Set points Solder iron ° F. | Set points Solder sled ° C. | Ramps | Splice type | Resistance nano ohms |
|---|---|---|---|---|---|---|
| CC218-SL5-2 | 1 | 361 | 184 | No | F-B | 2416 |
| | 2 | 361 | 184 | No | F-B | 2077 |
| | 3 | 361 | 184 | No | F-B | 1422 |
| | 4 | 361 | 184 | No | F-B | 1605 |
| CC218-SL5-22 | 1 | 351 | 179 | No | F-B | 1781 |
| | 2 | 351 | 179 | No | F-B | 1405 |
| | 3 | 351 | 174 | No | F-B | 1481 |
| | 4 | 351 | 174 | No | F-B | 1624 |
| CC218-SL4-4 | 1 | 351 | 179 | No | F-B | 1934 |
| | 2 | 351 | 179 | No | F-B | 1427 |
| | 3 | 351 | 174 | No | F-B | |
| | 4 | 351 | 174 | No | F-B | 2089 |
| | Average | | | | | 1672 |
| | Min | | | | | 1405 |
| | Max | | | | | 2416 |
| | Stdev | | | | | 316.8 |

TABLE 3

Processing conditions and resistance results for HTS to HTS overlaps made with stainless steel laminated 4.4 mm wide tapes. Splice overlap length is varied. Only individual overlaps were made for these tests. Resistance is given in terms of nano-ohms pre overlap. Strap splice resistance is the sum of the two overlap resistances.

| Wire number | Set points Solder iron ° F. | Set points Solder sled ° C. | Solder amount | Splice type | Splice length mm | Comments |
|---|---|---|---|---|---|---|
| CC249SL6 | 361 | 169 | ¼ tip | FF | 50 | Herm 1 50 mm 361° F. |
| CC249SL6 | 361 | 169 | ½ tip | FF | 100 | Herm 2 100 mm 361° F. |
| CC249SL6 | 361 | 169 | ¾ tip | FF | 150 | Herm 2 150 mm 361° F. |
| CC249SL1 | 361 | 169 | ¾ tip | FF | 125 | Herm 2 125 mm 361° F. |
| CC249SL4 | 371 | 179 | ¾ tip | FF | 125 | Herm 2 125 mm 371° F. |
| CC249SL1 | 361 | 169 | ¾ tip | FF | 125 | Herm 2 125 mm 361° F. In—Sn |
| CC249SL6 | 361 | 169 | ¾ tip | FF | 125 | Herm 2 361° F. Ramps |

TABLE 4

Statistics for Example 125 mm splices.

| Splice type | Resistance Average Nano-Ohms | Resistance Max Nano-Ohms | Resistance Min Nano-Ohms | Resistance STDEV Nano-Ohms |
|---|---|---|---|---|
| Herm 2 361° F. | 64.8 | 71 | 59 | 3.74 |
| Herm 2 361° F. In—Sn | 58.9 | 66 | 51 | 3.65 |
| Herm 2 361° F. Ramps | 62.6 | 77 | 57 | 7.00 |
| Herm 2 371° F. | 63.8 | 68 | 59 | 3.41 |
| All 125 mm splices | 62.4 | 77 | 51 | 4.97 |

Mechanical Results

Figure 6:
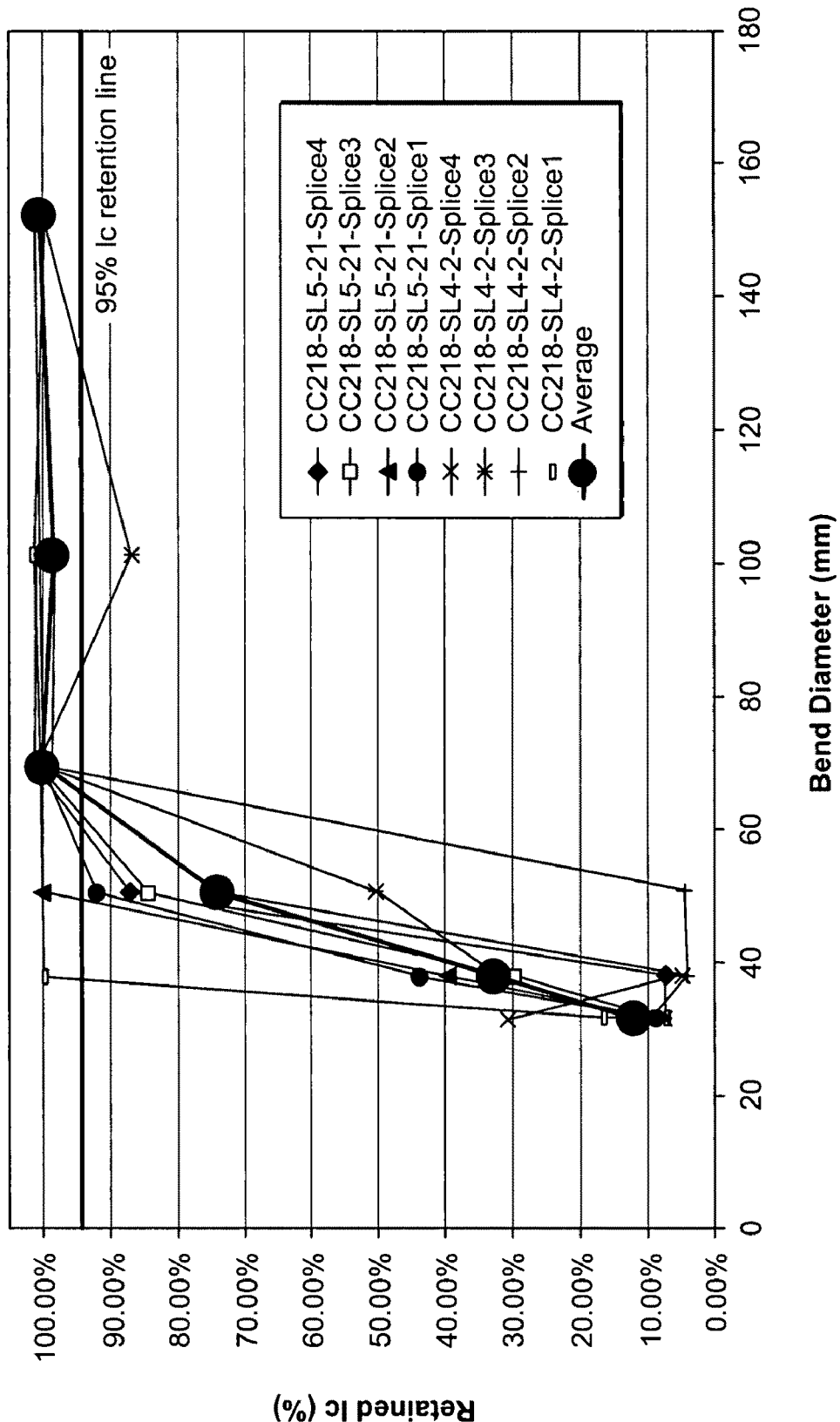
FIG. 6 is a plot of the double bend properties of several example spliced HTS wires.

The example strap splices were tested for double bend properties (forward and reverse bend and then measure) and twist testing. FIG. 6 shows the double bend test results for selected HTS to HTS splices made from the copper laminated 4.4 mm wide YBCO wire with an overlap of 25 mm, which are listed in Table 1 (wires denoted CC218-SL5-21 and CC218-SL4-2), as a function of bend diameter. Also plotted is the specification for brass hermetic wire of greater than 95% Ic retention after a 200 mm double bend diameter. Note that all eight splices had seen four double bends after receiving the 2" diameter bend. This test shows that the strap splice can retain 95% of its Ic with a double bend of 75 mm.

Figure 7:
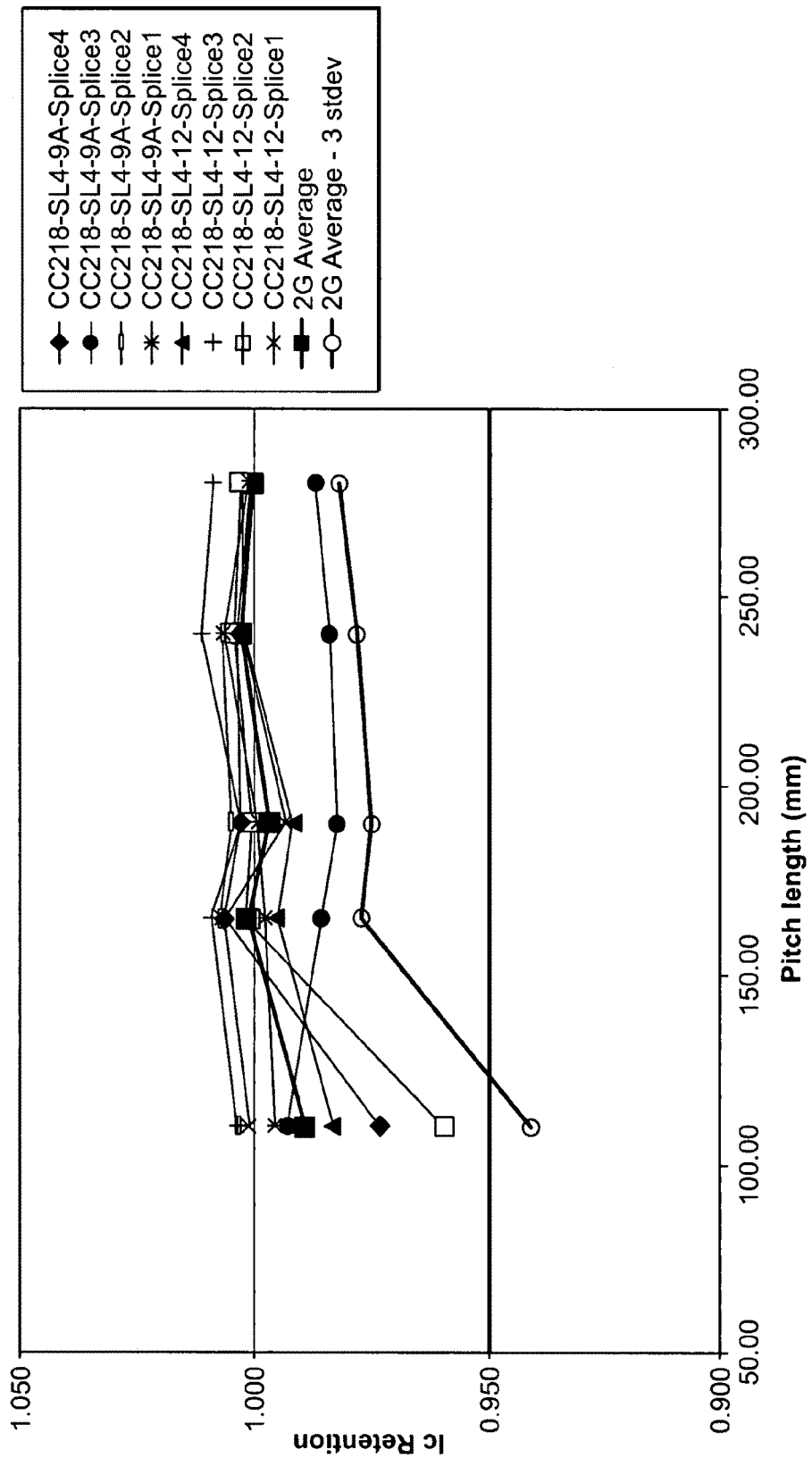
FIG. 7 is a plot of the splice wind tolerance Ic retention of several example spliced HTS wires.
Figure 8:
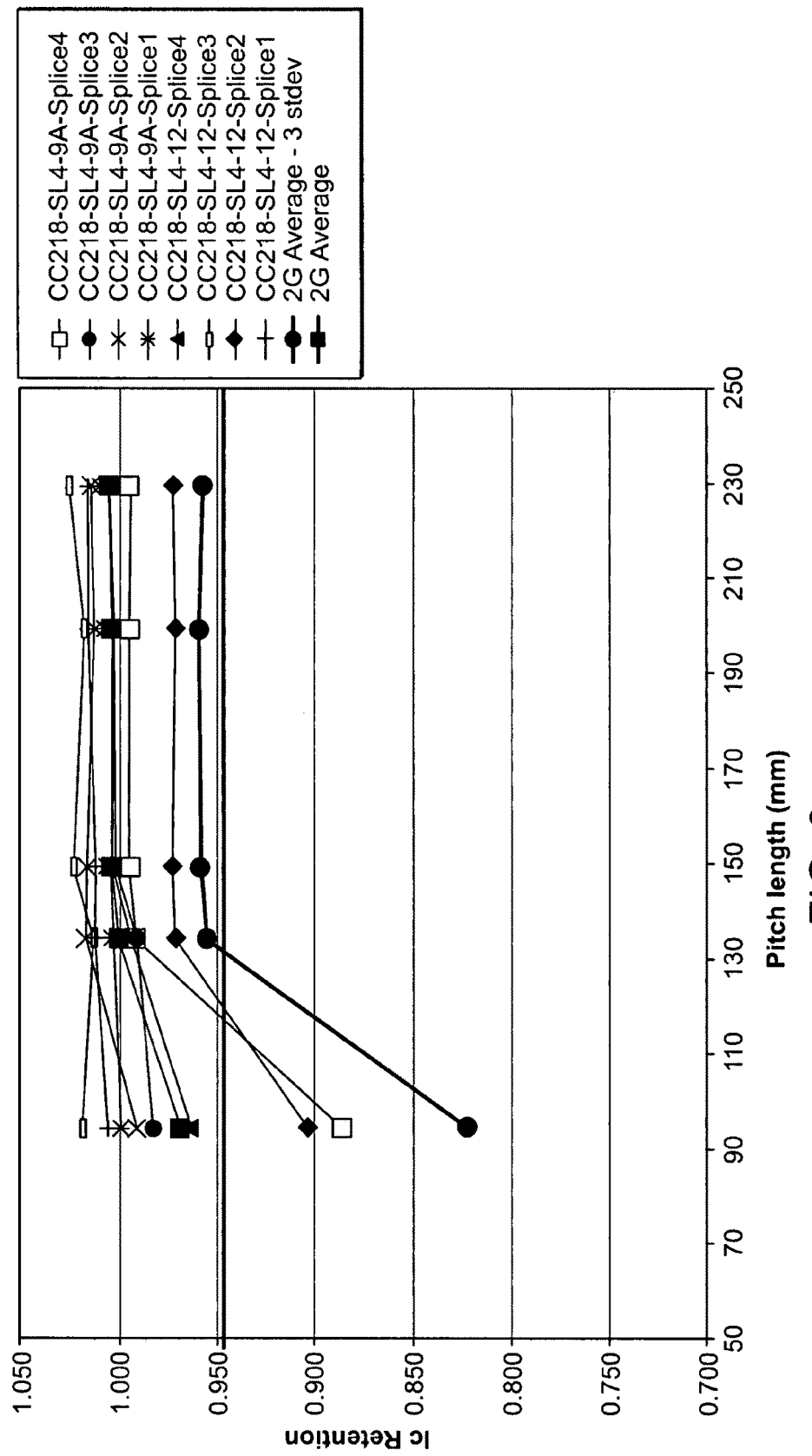
FIG. 8 is a plot of the splice wind tolerance Ic retention of several example spliced HTS wires.
Figure 9:
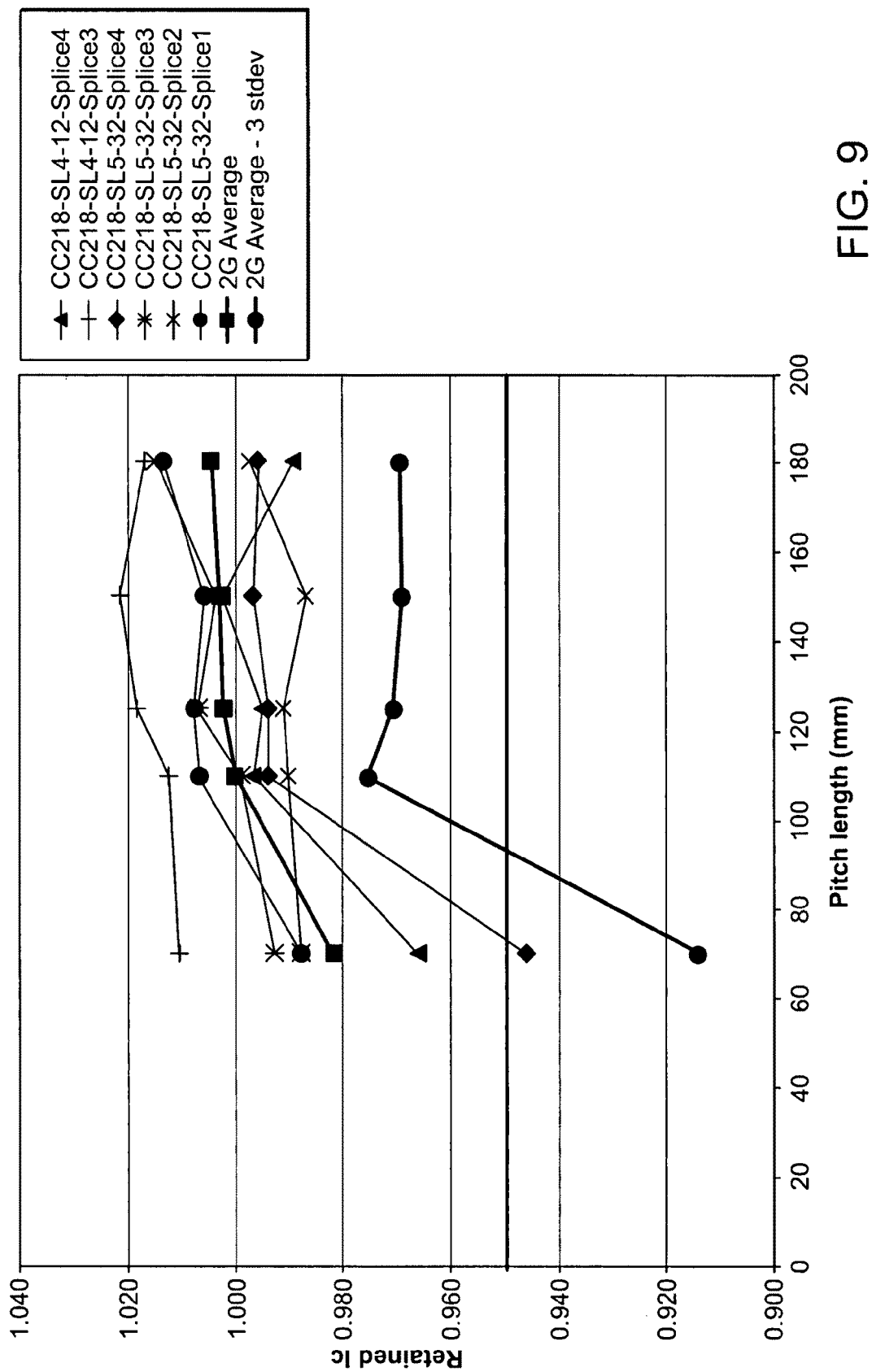
FIG. 9 is a plot of the splice wind tolerance Ic retention of several example spliced HTS wires.

The mechanical results shown in FIGS. 7, 8, and 9 are for selected HTS to HTS splices made from the copper laminated 4.4 mm wide YBCO wire with an overlap of 25 mm, which are listed in Table 1 (wires denoted CC218-SL4-9 and CC218-SL4-12). In FIGS. 7, 8, and 9, respectively, the spliced wires were wrapped around a former (a cylinder of known diameter, as known to those of skill in the art) with 25 mm 20 mm or 16 mm diameter. The Ic retention for the spliced wire was measured as a function of pitch length (length over which the wire is wrapped around the former diameter) with 10 pounds of tension. The retained Ic was measured over a 10 cm tap length at 77 K using a one microvolt/cm criteria. In all cases the strap splice made with YBCO wire met or exceeded the mechanical properties of BSCCO wire. In each plot, average minus-standard deviations is an indicator of minimum Ic retention over time.

The wind tolerance of a wire can be measured using the following steps:

(1) Test Ic of the spliced wire using a 30 cm (single overlap) and 1 meter tap length for the voltage taps.

(2) Attach the spliced wire (having a total length of about 1.35 meters) to a mandrel of desired diameter (e.g., 42 mm).

(3) Attach a desired weight to the free end of the spliced wire (e.g., 10 pounds).

(4) Allow the weight and spliced wire to hang freely from the mandrel.

(5) Adjust the pitch of the mandrel (with respect to gravity) to allow the wire to wind onto the mandrel at the desired pitch.

(6) Wind the spliced wire onto the mandrel.

(7) Unwind the spliced wire.

(8) Test the Ic of the spliced wire using a 30 cm (single overlap) and 1 meter tap length for the voltage taps.

(9) Calculate the retained Ic by dividing the second Ic measurement (Ic final) by the first Ic (Ic initial). If the resulting value is greater than about 0.95, the spliced wire is judged to have retained a sufficient Ic for normal use.

Figure 10:
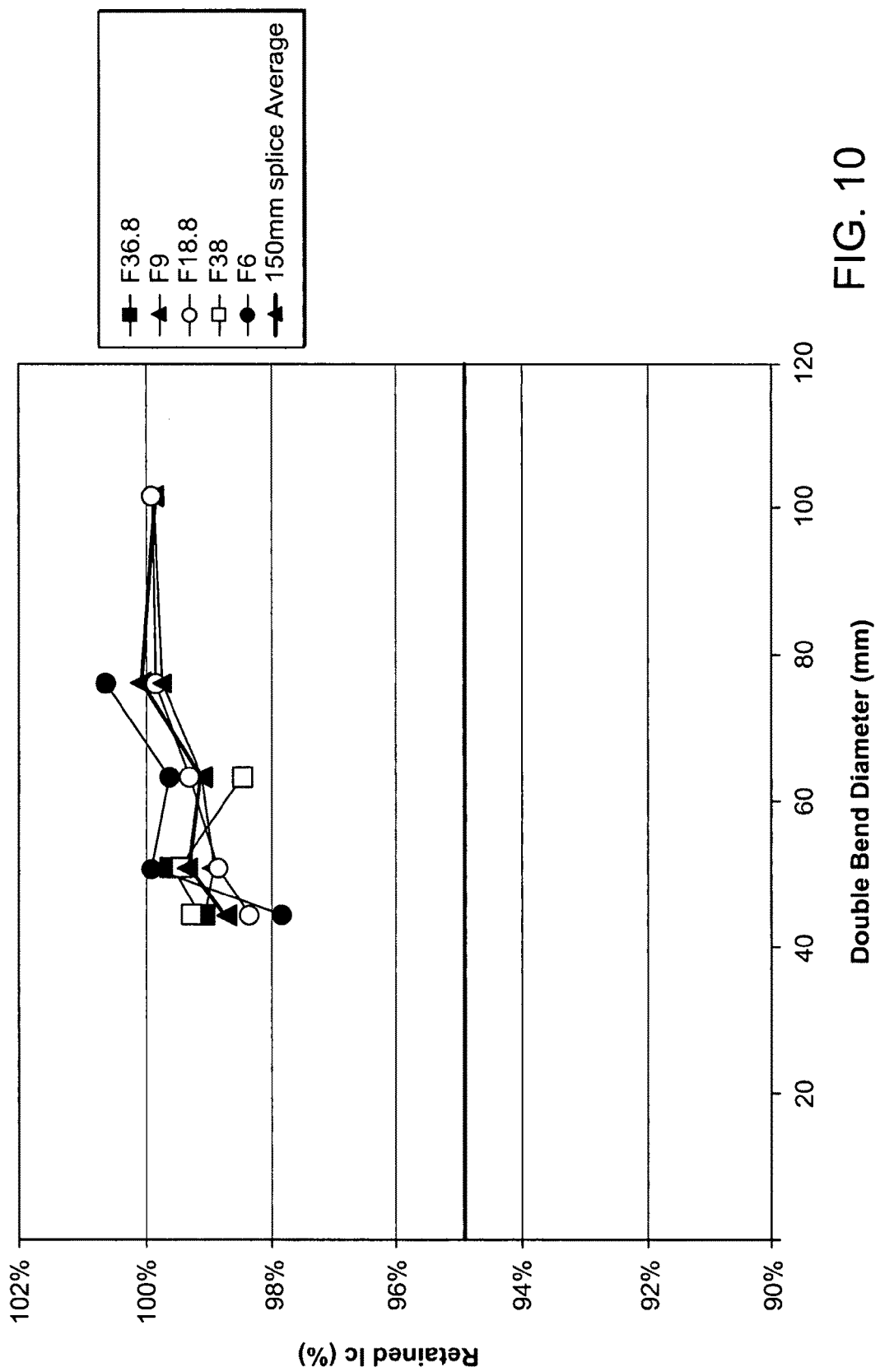
FIG. 10 is a plot of the double bend properties of several example spliced HTS wires.
Figure 11:
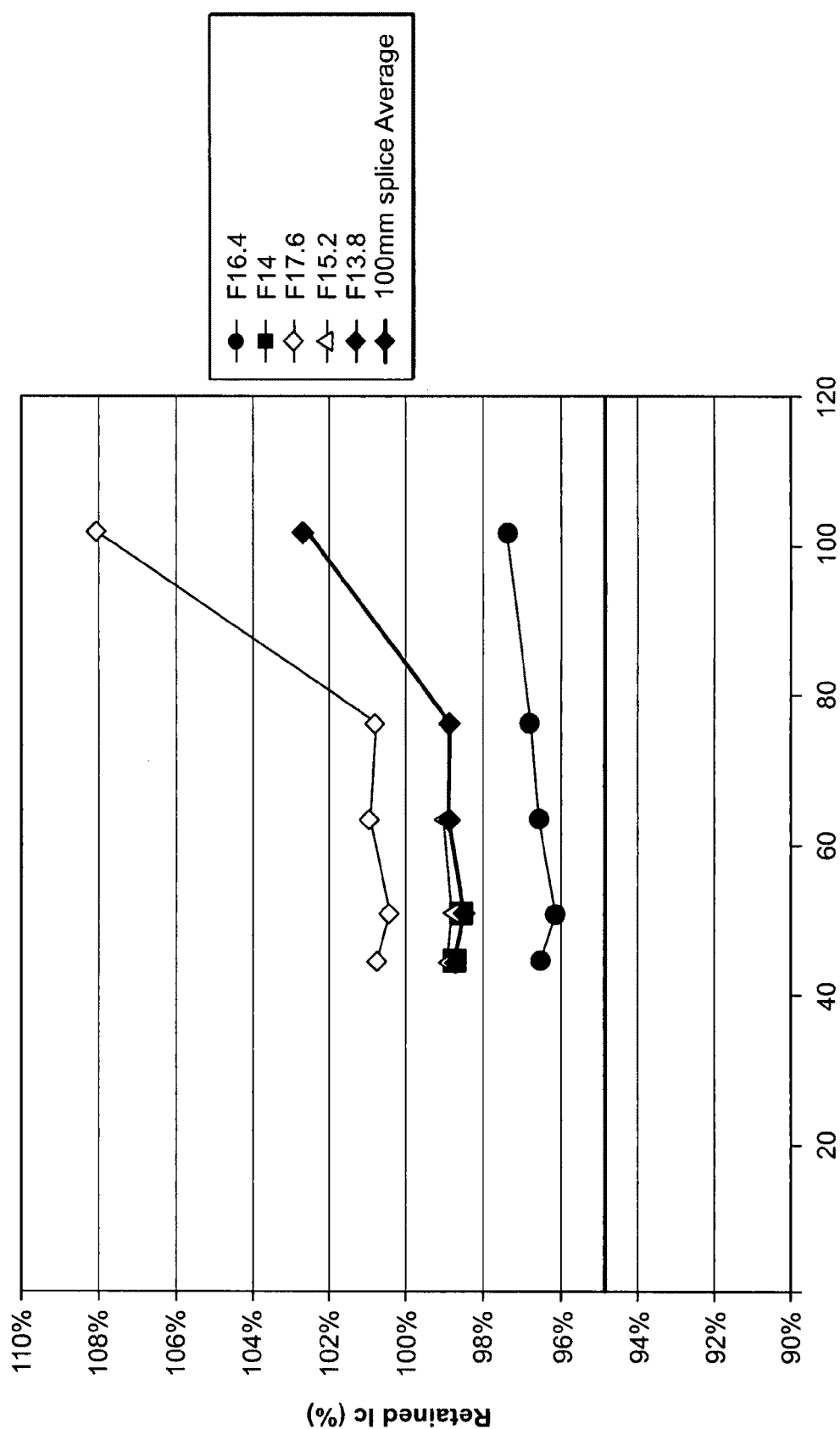
FIG. 11 is a plot of the double bend properties of several example spliced HTS wires.
Figure 12:
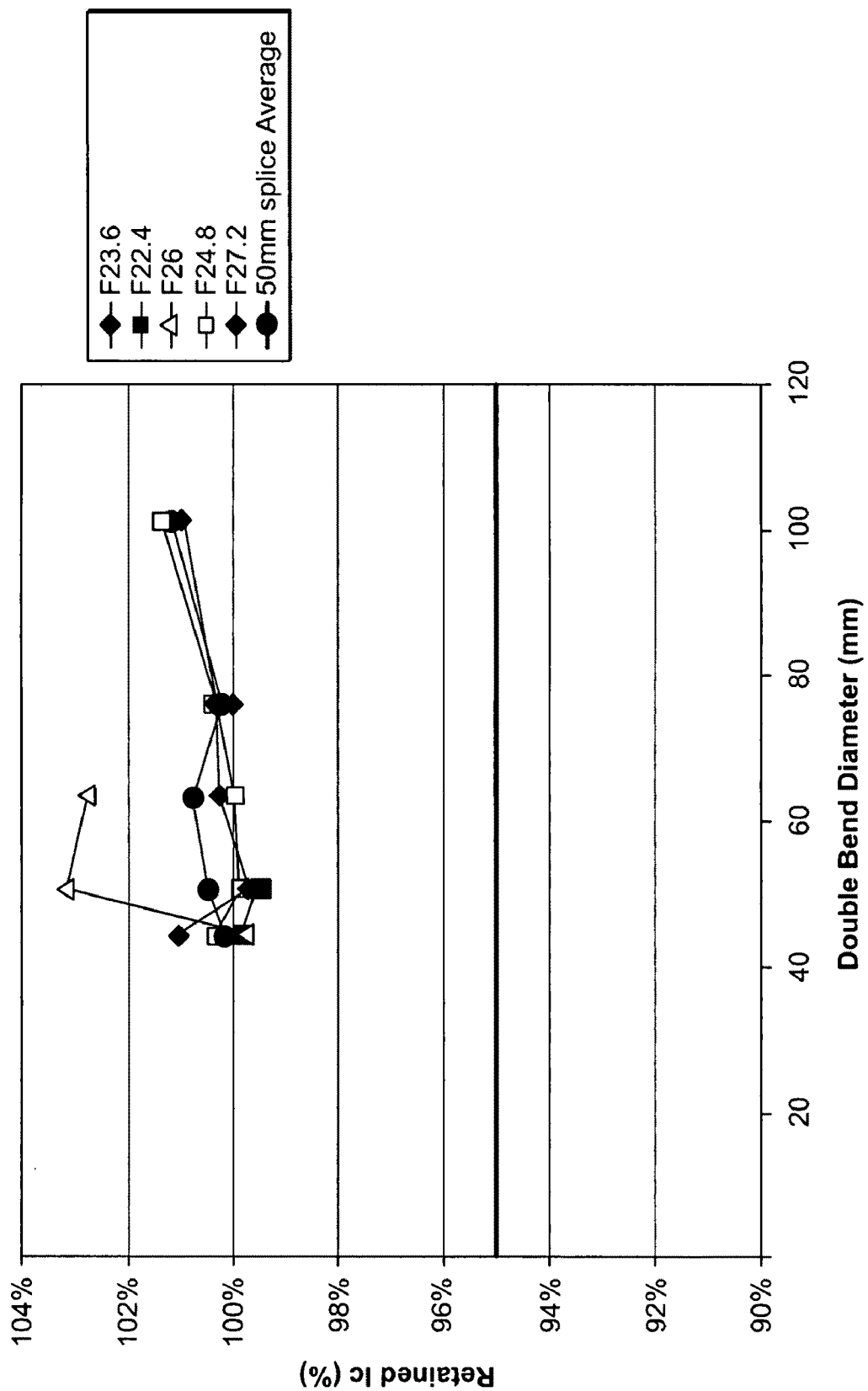
FIG. 12 is a plot of the double bend properties of several example spliced HTS wires.

Other exemplary strap splices made using 4.4 mm wide YBCO-based HTS wire that were laminated with stainless steel stabilizer strips using indium solder, according to the embodiment of FIGS. 2E-2F and using the exemplary method described above, and tested for double bend tolerance. FIGS. 10-12 show the mechanical performance of selected splices with overlap lengths of 50, 100 and 150 mm (spliced wire CC249-SL6, listed in Table 3). In all cases the exemplary splices retained greater than 95% of their Ic after receiving a double bend down to 42 mm diameter.

The bend tolerance of a wire can be measured using the following steps:

(1) Test Ic of the spliced wire using a 30 cm (single overlap) and 1 meter tap length for the voltage taps.

(2) Attach the spliced wire (having a total length of about 1.35 meters) to a mandrel of desired diameter (e.g., 42 mm).

(3) Attach a desired weight to the free end of the spliced wire (e.g., 10 pounds).

(4) Allow the weight and spliced wire to hang freely from the mandrel.

(5) Wind the spliced wire onto the mandrel, laying the turns within 1 cm of each other.

(6) Unwind the spliced wire.

(7) Turn the spliced wire over, such that the opposite face of the wire (the one that had not been in contact with the mandrel) will now be in contact with the mandrel.

(8) Wind the spliced wire onto the mandrel, laying the turns within 1 cm of each other.

(9) Unwind the spliced wire.

(10) Test the Ic of the spliced wire using a 30 cm (single overlap) and 1 meter tap length for the voltage taps.

(11) Calculate the retained Ic by dividing the second Ic measurement (Ic final) by the first Ic (Ic initial). If the resulting value is greater than about 0.95, the spliced wire is judged to have retained a sufficient Ic for normal use.

FIG. 10 shows double bend mechanical results for stainless steel laminated YBCO wire strap splices (wire CC249-SL6) with an overlap length of 150 mm.

FIG. 11 shows double bend mechanical results for stainless steel laminated YBCO HTS wire strap splices (wire CC249-SL6) with an overlap length of 100 mm.

FIG. 12 shows double bend mechanical results for stainless steel laminated YBCO wire strap splices (wire CC249-SL6) with an overlap length of 50 mm.

Figure 13:
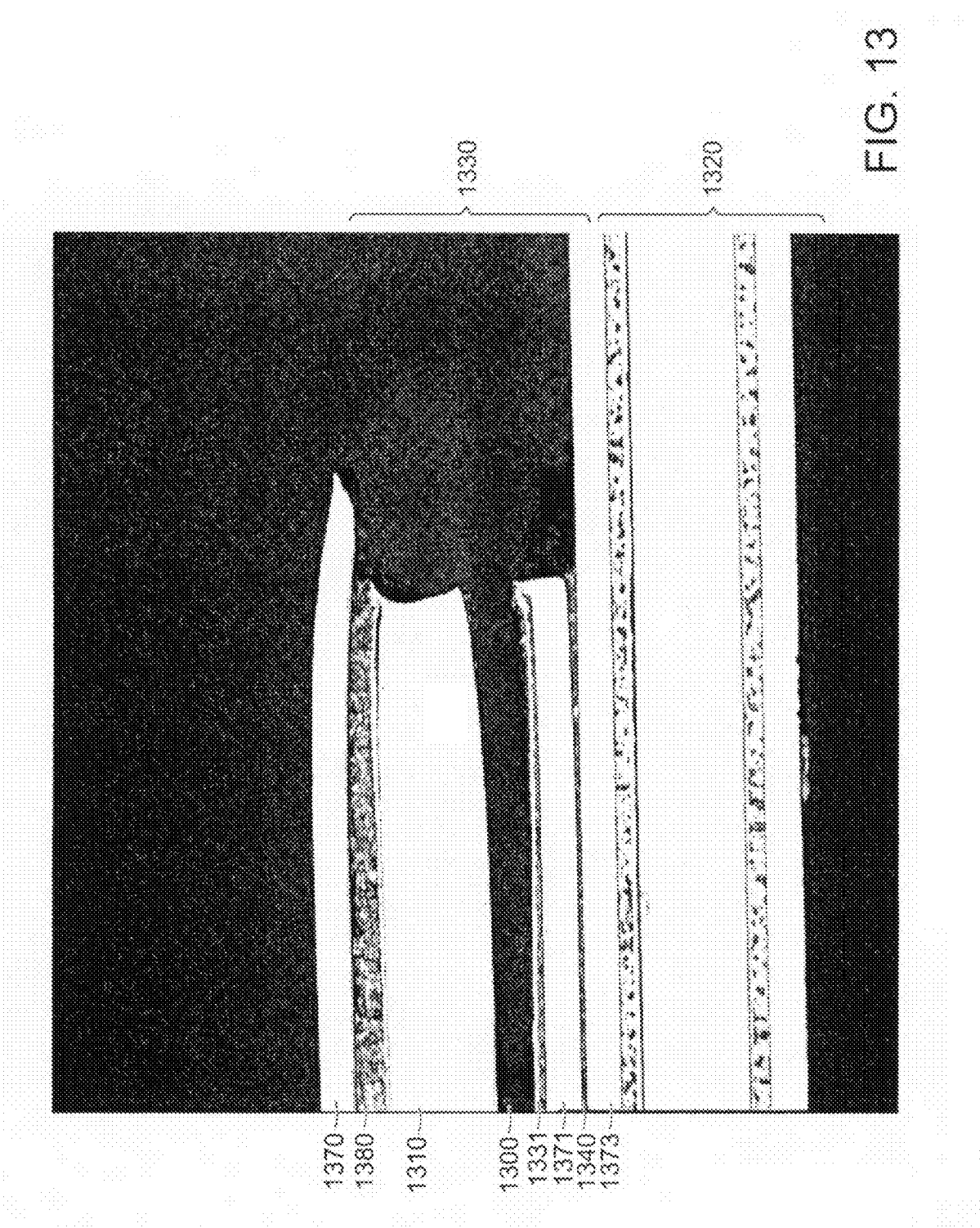
FIG. 13 is a micrograph of an exemplary spliced HTS wire.

Another mechanical result is the performance of the ramp. FIG. 13 is a micrograph of an exemplary spliced wire similar to that shown in FIGS. 2E-2F, using pure indium solder 1340 to join conductive bridge 1330 to wire 1320, but with no solder "ramps" (e.g., edge seal 250" similar to that shown in FIG. 2E). FIG. 13 shows the tip of an overlap that was double bent over a 100 mm mandrel, in which the lift off in the HTS layer can clearly be seen. Specifically, the conductive bridge 1330 includes an upper stabilizer layer 1370, a layer of filler 1380 bonding the stabilizer to substrate 1310, a buffer/HTS/cap layer assembly 1331, and lower stabilizer 1371. The wire 1320 is similarly constructed, and has upper stabilizer layer 1373 which is bonded to the lower stabilizer 1371 of conductive bridge 1330 with solder 1340. As FIG. 13 clearly shows, after double blending over a 100 mm mandrel, the buffer/HTS/cap layer assembly 1331 separates from substrate 1310, leaving a large gap 1300 between the two. This can results in a significant degradation in performance. The mechanical degradation can be avoided by appropriately selecting materials and/or architecture of the wire.

Figure 14:
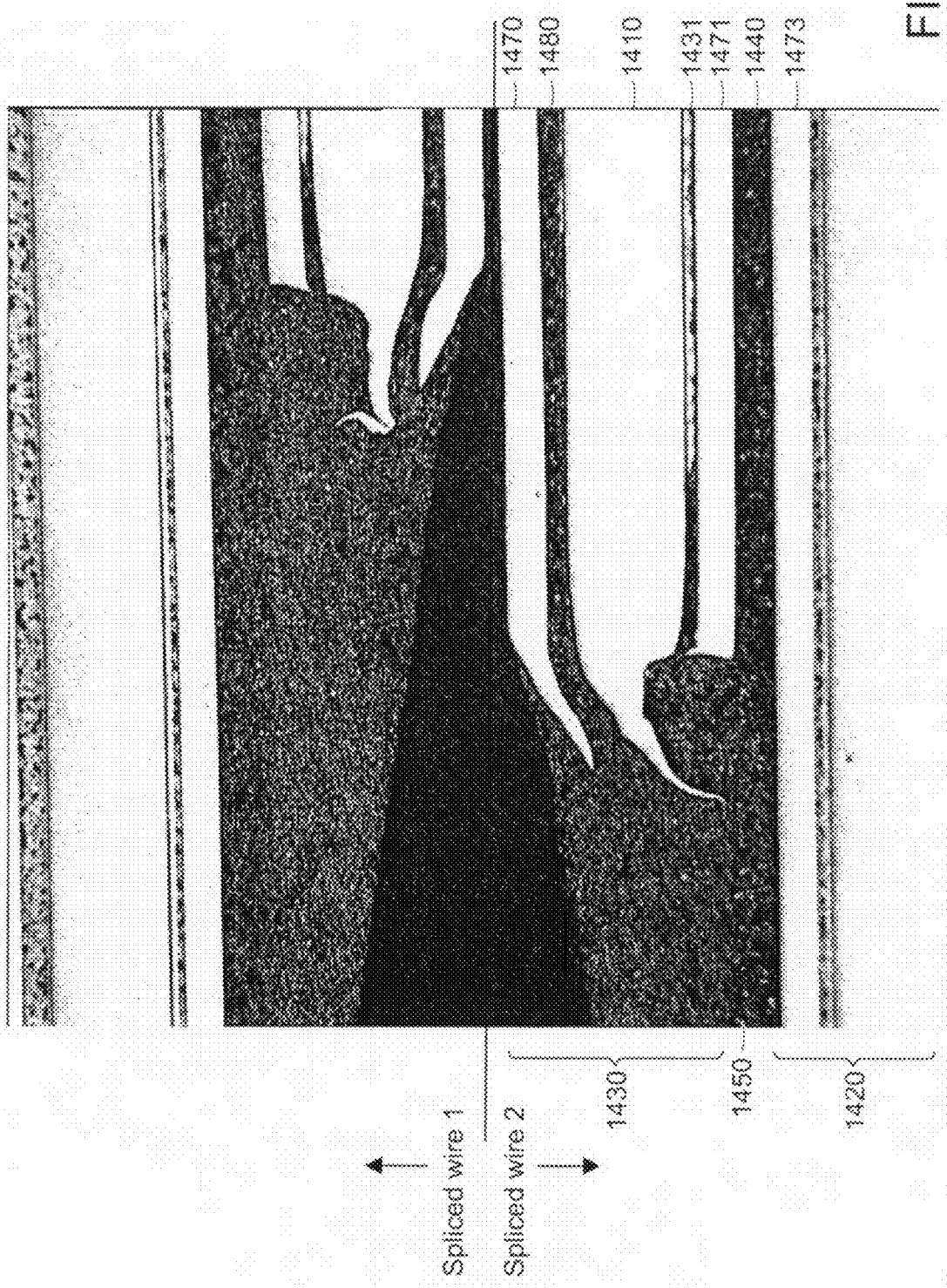
FIG. 14 is a micrograph of an exemplary spliced HTS wire.

FIG. 14 is a micrograph of a similar structure to that shown in FIG. 13, but which includes a solder "ramp" (e.g., edge seal 250" similar to that shown in FIG. 2E). FIG. 14 shows two separate spliced wire assemblies, each of which was constructed separately from each other, which are arranged next to each other in the micrograph. The following discussion focuses on "Spliced wire 2", which appears in the bottom of the micrograph, but applies equally to "Spliced wire 1," in the top of the micrograph. Like the spliced wire shown in FIG. 13, Spliced wire 2 includes a conductive bridge 1430 that is spliced to a wire 1420 with solder 1440. The conductive bridge 1430 includes an upper stabilizer layer 1470, a layer of filler 1480 bonding the stabilizer to substrate 1410, a buffer/HTS/cap layer assembly 1431, and lower stabilizer 1471. The wire 1420 is similarly constructed, and has upper stabilizer layer 1473 which is bonded to the lower stabilizer 1471 of conductive bridge 1430 with solder 1440. Unlike the example shown in FIG. 13, the example in FIG. 14 includes a solder "ramp" 1450 that both seals the end of conductive bridge 1430 and improves the mechanical performance of the joint.

FIG. 14 is a micrograph of a pure Indium splice with solder ramps. FIG. 14 shows the tip of an overlap receiving a double bend over a 50 mm mandrel, in which the lack of separation of the HTS layer can clearly be seen. This demonstrates that the ramp helps to provide a strap splice that is mechanically and environmentally robust.

Example Process Parameters for Making Strap Splice, Using Sn—Pb or Sn—Pb—Ag Solder Solder: Sn—Pb or Sn—Pb—Ag.

Soldering Iron temperature: 400° F. to 450° F.

Soldering Sled temperature: 205° C. to 220° C.

Solder Sled pressure: 5-25 pounds.

Strap Length: Greater than or equal to 0.1 m plus overlap length times 2. Typically a 0.7 meter strap length yields a strap splice overlap of 100 mm.

Example Procedure for Making a Strap Splice with a 100 mm Overlap Length, Using Sn—Pb or Sn—Pb—Ag Solder 1) Identify the HTS side of the two wires to be joined.

2) Cut 0.7 meter section off one or the wires to make the strap.

3) Write the wire number on the HTS side of both the wire and the strap.

4) Apply flux to the HTS side of the wire.

5) Using ~$^{6}/_{32}$" of 0.032" diameter 60 Sn-40 Pb solder pretin the HTS side of the payoff wire for a length of 110 mm.

6) Excess 60 Sn-40 Pb should be left on the tip of the wire.

7) Cut off the excess 60 Sn-40 Pb. This will be a blob on the end of the wire.

8) Place a 45° Chamfer on the end of the wire on both edges.

9) Measure 100 mm from the tip of the wire and mark the wire on the untinned side.

10) Repeat this process for both ends of the strap and the take-up wire.

11) Place take up wire into the solder sled fixture with the HTS side up.

12) Apply flux to the surface of the Take-up wire.

13) Apply flux to the HTS side of the strap.

14) Place the HTS side of the strap unto the HTS side of the take-up wire aligning the 100 mm mark with the tip of the take-up wire 15) Using the solder sled, solder the two pieces together according to work instructions.

16) After the two sections are soldered together remove wire from solder sled fixture. One overlap is complete.

17) Repeat steps 9 to 11 to solder the strap to the other wire. In this case the strap will be on the take-up side.

Alternate ways of making the joint include using a die that can both solder the wires together and form a ramp. This can replace the knifing technique.

Ultrasonic welding can be used in place of soldering wires to a conductive bridge. Briefly, as is known to those of skill in the art, ultrasonic welding uses high-frequency oscillations, generated by a transducer (e.g., a piezoelectric transducer) to weld metal parts together. A sonotrode is used to induce oscillation of one workpiece against another, which creates a large amount of friction between the workpieces. This friction removes impurities at the workpiece surfaces, and causes metal at the surfaces to diffuse together, forming a bond without causing bulk heating of the workpiece.

Cold welding can also be used in place of soldering wires to a conductive bridge. Systems and methods for cold welding metal layers are known in the art.

Incorporation By Reference

The following documents are hereby incorporated by reference in their entirety: U.S. Pat. No. 5,231,074, issued on Jul. 27, 1993, and entitled "Preparation of Highly Textured Oxide Superconducting Films from MOD Precursor Solutions;" U.S. Pat. No. 6,022,832, issued Feb. 8, 2000, and entitled "Low Vacuum Process for Producing Superconductor Articles with Epitaxial Layers;" U.S. Pat. No. 6,027,564, issued Feb. 22, 2000, and entitled "Low Vacuum Process for Producing Epitaxial Layers;" U.S. Pat. No. 6,190,752, issued Feb. 20, 2001, and entitled "Thin Films Having Rock-Salt-Like Structure Deposited on Amorphous Surfaces;" U.S. Pat. No. 6,537,689, issued Mar. 25, 2003, and entitled "Multi-Layer Superconductor Having Buffer Layer With Oriented Termination Plane;" PCT Publication No. WO 00/58530, published on Oct. 5, 2000, and entitled "Alloy Materials;" PCT Publication No. WO/58044, published on Oct. 5, 2000, and entitled "Alloy Materials;" PCT Publication No. WO 99/17307, published on Apr. 8, 1999, and entitled "Substrates with Improved Oxidation Resistance;" PCT Publication No. WO 99/16941, published on Apr. 8, 1999, and entitled "Substrates for Superconductors;" PCT Publication No. WO 98/58415, published on Dec. 23, 1998, and entitled "Controlled Conversion of Metal Oxyfluorides into Superconducting Oxides;" PCT Publication No. WO 01/11428, published on Feb. 15, 2001, and entitled "Multi-Layer Articles and Methods of Making Same;" PCT Publication No. WO 01/08232, published on Feb. 1, 2001, and entitled "Multi-Layer Articles And Methods Of Making Same;" PCT Publication No. WO 01/08235, published on Feb. 1, 2001, and entitled "Methods And Compositions For Making A Multi-Layer Article;" PCT Publication No. WO 01/08236, published on Feb. 1, 2001, and entitled "Coated Conductor Thick Film Precursor;" PCT Publication No. WO 01/08169, published on Feb. 1, 2001, and entitled "Coated Conductors With Reduced A.C. Loss;" PCT Publication No. WO 01/15245, published on Mar. 1, 2001, and entitled "Surface Control Alloy Substrates And Methods Of Manufacture Therefore;" PCT Publication No. WO 01/08170, published on Feb. 1, 2001, and entitled "Enhanced Purity Oxide Layer Formation;" PCT Publication No. WO 01/26164, published on Apr. 12, 2001, and entitled "Control of Oxide Layer Reaction Rates;" PCT Publication No. WO 01/26165, published on Apr. 12, 2001, and entitled "Oxide Layer Method;" PCT Publication No. WO 01/08233, published on Feb. 1, 2001, and entitled "Enhanced High Temperature Coated Superconductors;" PCT Publication No. WO 01/08231, published on Feb. 1, 2001, and entitled "Methods of Making A Superconductor;" PCT Publication No. WO 02/35615, published on Apr. 20, 2002, and entitled "Precursor Solutions and Methods of Making Same;" PCT Publication No. WO 2005/121414, published on Dec. 22, 2005, and entitled "Deposition of Buffer Layers on Textured Metal Surfaces;" PCT Publication No. WO 2005/081710, published on Sep. 9, 2005, and entitled "Oxide Films with Nanodot Flux Pinning Centers;" U.S. Pat. No. 6,436,317, issued on Aug. 20, 2002, and entitled, "Oxide Bronze Compositions And Textured Articles Manufactured In Accordance Therewith;" U.S. Provisional Patent Application Ser. No. 60/309,116, filed on Jul. 31, 2001, and entitled "Multi-Layer Superconductors And Methods Of Making Same;" U.S. Pat. No. 6,797,313, issued on Sep. 28, 2004, and entitled "Superconductor Methods and Reactor;" U.S. Provisional Patent Application Ser. No. 60/308,957, filed on Jul. 31, 2001, and entitled "Superconductor Methods and Reactors;" U.S. Provisional Patent Application Ser. No. 60/166,297, filed on Nov. 18, 1999, and entitled "Superconductor Articles and Compositions and Methods for Making Same;" U.S. Pat. No. 6,974,501, issued on Dec. 13, 2005, and entitled "Superconductor Articles and Compositions and Methods for Making Same;" U.S. patent application Ser. No. 10/955,866, filed on Sep. 29, 2004, and entitled "Dropwise Deposition of a Patterned Oxide Superconductor;" U.S. patent application Ser. No. 11/241,636, filed on Sep. 30, 2005, and entitled "Thick Superconductor Films with Improved Performance;" U.S. patent application Ser. No. 10/955,875, filed on Sep. 29, 2004, and entitled "Low AC Loss Filamentary Coated Superconductors;" U.S. patent application Ser. No. 10/955,801, filed on Sep. 29, 2004, and entitled "Stacked Filamentary Coated Superconductors;" U.S. Provisional patent application Ser. No. 60/667,001, filed on Mar. 31, 2005, and entitled "Mesh-Type Stabilizer for Filamentary Coated Superconductors;" U.S. patent application Ser. No. 11/193,262, filed on Jul. 29, 2005, and entitled "Architecture for High Temperature Superconducting Wire;" U.S. Provisional patent application Ser. No. 60/703,815, filed Jul. 29, 2005, and entitled "High Temperature Superconducting Wires and Coils;" U.S. Provisional patent application Ser. No. 60/703,836, filed Jul. 29, 2005, and entitled "Thick Superconductor Films With Improved Performance;" PCT Publication No. WO 06/021003, published on Aug. 19, 2005, and entitled "Stacked Filamentary Coated Superconductors;" PCT Publication No. WO 06/023826, published on Aug. 19, 2005, and entitled "Low AC Loss Filamentary Coated Superconductors;" U.S. Provisional patent application Ser. No. 60/757,855, filed Jan. 10, 2006, and entitled "Method of Patterning Oxide Superconducting Films;" U.S. patent application Ser. No. 11/393,626, filed Mar. 30, 2006, and entitled "Mesh0Type Stabilizer for Filamentary Coated Superconductors;" U.S. patent application Ser. No. 11/490,779, filed Jul. 21, 2006, and entitled "Fabrication of Sealed High Temperature Superconductor Wires;" U.S. Provisional patent application Ser. No. 60/832,716, filed Jul. 21, 2006, and entitled "High Current, Compact Flexible Conductors Containing High Temperature Superconducting Tapes;" U.S. Provisional patent application Ser. No. 60/832,724, filed Jul. 21, 2006, and entitled "Low Resistance Splice for High Temperature Superconductor Wires;" U.S. Provisional patent application Ser. No. 60/832,871, filed Jul. 25, 2006, and entitled "High Temperature Superconductors Having Planar Magnetic Flux Pinning Centers and Methods For Making The Same;" U.S. Provisional patent Application Ser. No. 60/866,148, filed Nov. 16, 2006, and entitled "Electroplated High-Resistivity Stabilizers In High Temperature Superconductors And methods Thereof;" U.S. patent application Ser. No. 11/728,108, filed Mar. 23, 2007, and entitled "Systems and Methods For Solution-Based Deposition of Metallic Cap Layers For High Temperature Superconductor Wires;" U.S. Provisional patent application Ser. No. 60/922,145, filed Apr. 6, 2007, and entitled "Composite Substrates For High Temperature Superconductors Having Improved Properties;" and U.S. patent application, filed concurrently herewith, entitled "Low Resistance Splice For High Temperature Superconductor Wires."

The invention may be embodied in other specific forms without departing from the spirit or essential characteristics thereof. The present embodiments are therefore to be considered in respects as illustrative and not restrictive.

What is claimed is:

1. A laminated, spliced superconductor wire, said spliced wire comprising:
   (a) a superconductor joint, comprising:
      (i) first and second superconductor wires, each wire comprising
         a substrate,
         a superconductor layer overlying the substrate, and
         a cap layer overlying the superconductor layer; and
      (ii) a conductive bridge, the conductive bridge comprising
         a substrate,
         a superconductor layer overlying the substrate, and
         a cap layer overlying the superconductor layer,
         wherein the cap layer of the conductive bridge is in electrically conductive contact with a portion of the cap layer of each of the first and second superconductor wires through an electrically conductive bonding material, the electrically conductive bonding material comprising low resistance solder that forms edge seals on an end of each of the first and second superconductor wires and on first and second ends of the conductive bridge;
   (b) a stabilizer structure surrounding at least a portion of the superconductor joint, wherein the superconductor joint is in electrical contact with first and second stabilizer strips; and
   (c) a substantially nonporous electrically conductive filler, wherein the filler substantially surrounds the superconductor joint.

2. The spliced wire of claim 1, wherein the conductive bridge has a length selected to provide the superconductor joint with a predetermined conductivity.

3. The spliced wire of claim 1, wherein the conductive bridge is bonded to at least ten millimeters of the cap layers of each of the first and second superconductor wires.

4. The spliced wire of claim 1, wherein the conductive bridge is bonded to at least ten centimeters of the cap layers of each of the first and second superconductor wires.

5. The spliced wire of claim 1, wherein the conductive bridge comprises a section cut from one of the first and second superconductor wires.

6. The spliced wire of claim 1, wherein the filler bonds the stabilizer structure to the superconductor joint.

7. The spliced wire of claim 1, wherein the conductive filler comprises a material selected from the group consisting of solder, metal, metal alloy, metal amalgam, and conductive polymer.

8. The spliced wire of claim 1, wherein the conductive filler and the conductive bonding material have the same composition.

9. The spliced wire of claim 1, wherein the conductive filler and the conductive bonding material have melting points that differ by less than about 10%.

10. The spliced wire of claim 1, wherein the low resistance solder comprises one of indium, Pb—Sn, and Pb—Sn—Ag.

11. The spliced wire of claim 1, wherein an end of at least one of the first and second superconductive wires and the conductive bridge is cut so as to mitigate stress in the spliced wire.

12. The spliced wire of claim 1, wherein at least one of said ends is cut on a diagonal.

13. The spliced wire of claim 1, further comprising insulation surrounding at least the superconductor joint.

14. The spliced wire of claim 1, wherein the first and second superconductor wires and the conductive bridge each further comprise a buffer layer between the substrate and the superconductor layer.

15. The spliced wire of claim 1, wherein the cap layers of the first and second superconductor wires and the cap layer of the conductive bridge comprise silver.

16. The spliced wire of claim 1, wherein the stabilizer structure comprises a metal selected from the group consisting of aluminum, copper, silver, nickel, iron, stainless steel, aluminum alloy, copper alloy, silver alloy, nickel alloy, and iron alloy.

17. The spliced wire of claim 1, wherein a conductive pathway between the first and second wires has a resistance of less than about 1 milli-ohm.

18. The spliced wire of claim 1, wherein a conductive pathway between the first and second wires has a resistance of less than about 500 micro-ohms.

19. The spliced wire of claim 1, wherein a conductive pathway between the first and second wires has a resistance of less than about 200 milli-ohms.

20. The spliced wire of claim 1, wherein a conductive pathway between the first and second wires has a resistance of less than about 100 milli-ohms.

21. The spliced wire of claim 1, wherein at least one of the edge seals comprises a solder ramp.

22. The spliced wire of claim 1, wherein at least one of the seals comprises a solder bead.

23. A laminated, spliced superconductor wire, comprising:
   (a) first and second stabilized superconductor wires, each wire comprising
      a substrate,
      a superconductor layer overlying the substrate,
      a cap layer overlying the superconductor layer, and
      stabilizer structure bonded with electrically conductive filler to the cap layer;
   (b) a conductive bridge, the conductive bridge comprising
      a substrate,
      a superconductor layer overlying the substrate,
      a cap layer overlying the superconductor layer, and
      a stabilizer structure bonded with electrically conductive filler to the cap layer,
      wherein the conductive bridge is in electrically conductive contact with a portion of each of the first and second superconductor wires through an electrically conductive bonding material that comprises a low resistance solder; and
   (c) a plurality of edge seals formed by said low resistance solder, said plurality of edge seals including,
      a first edge seal substantially sealing an end of the first wire,
      a second edge seal substantially sealing an end of the second wire, and
      third and fourth edge seals respectively substantially sealing first and second ends of the conductive bridge.

24. The spliced wire of claim 23, wherein the stabilizer structures of each of the first wire, second wire, and conductive bridge are thinned in regions where the conductive bridge is in electrically conductive contact with the first and second wires.

25. The spliced wire of claim 23, wherein the stabilizer structures of each of the first wire, second wire, and conductive bridge are removed in regions where the conductive bridge is in electrically conductive contact with the first and second wires.

26. The spliced wire of claim 23, wherein the conductive bridge is in electrically conductive contact with at least ten millimeters of each of the first and second superconductor wires.

27. The spliced wire of claim 23, wherein the conductive bridge is in electrically conductive contact with at least ten centimeters of each of the first and second superconductor wires.

28. The spliced wire of claim 23, wherein the conductive filler and the conductive bonding material have melting points that differ by less than about 10%.

29. The spliced wire of claim 23, wherein a conductive pathway between the first and second wires has a resistance of less than about 1 milli-ohm.

30. The spliced wire of claim 23, wherein a conductive pathway between the first and second wires has a resistance of less than about 500 micro-ohms.

31. The spliced wire of claim 23, wherein a conductive pathway between the first and second wires has a resistance of less than about 200 milli-ohms.

32. The spliced wire of claim 23, wherein a conductive pathway between the first and second wires has a resistance of less than about 100 milli-ohms.

33. The spliced wire of claim 23, wherein the stabilizer structure comprises first and second stabilizer strips.

34. The spliced wire of claim 23, wherein the electrically conductive bonding material and the conductive filler each comprise low resistance solder.

35. The spliced wire of claim 34, wherein the low resistance solder comprises one of indium, Pb—Sn, and Pb—Sn—Ag.

* * * * *